United States Patent
Kyles et al.

(10) Patent No.: US 9,444,146 B2
(45) Date of Patent: Sep. 13, 2016

(54) INTEGRATED CIRCUIT WITH ELECTROMAGNETIC COMMUNICATION

(75) Inventors: Ian A. Kyles, West Linn, OR (US); Gary D. McCormack, Tigard, OR (US)

(73) Assignee: Keyssa, Inc., Campbell, CA (US)

( * ) Notice: Subject to any disclaimer, the term of this patent is extended or adjusted under 35 U.S.C. 154(b) by 441 days.

(21) Appl. No.: 13/427,576

(22) Filed: Mar. 22, 2012

(65) Prior Publication Data

US 2012/0263244 A1    Oct. 18, 2012

Related U.S. Application Data

(60) Provisional application No. 61/467,334, filed on Mar. 24, 2011.

(51) Int. Cl.
*H04L 25/02* (2006.01)
*H01Q 19/02* (2006.01)
(Continued)

(52) U.S. Cl.
CPC ...... *H01Q 19/021* (2013.01); *H01L 23/49861* (2013.01); *H01L 23/66* (2013.01); *H01Q 1/48* (2013.01); *H01Q 7/00* (2013.01); *H01Q 9/26* (2013.01); *H01Q 19/18* (2013.01); *H01L 23/3128* (2013.01); *H01L 23/49816* (2013.01);
(Continued)

(58) Field of Classification Search
CPC ... H01L 23/49861; H01L 23/66; H01Q 7/00; H01Q 9/26
USPC ......... 343/702, 700 MS, 873, 803, 741, 850; 375/259, 219, 295, 319
See application file for complete search history.

(56) References Cited

U.S. PATENT DOCUMENTS

| | | |
|---|---|---|
| 2,753,551 A | 7/1956 | Richmond |
| 3,796,831 A | 3/1974 | Bauer |

(Continued)

FOREIGN PATENT DOCUMENTS

| | | |
|---|---|---|
| CN | 2237914 Y | 10/1996 |
| CN | 1178402 A | 4/1998 |

(Continued)

OTHER PUBLICATIONS

Eric A. Juntunen, "60 GHz CMOS Pico-Joule/Bit Oook Receiver Design for Multi-Gigabit Per Second Wireless Communications" thesis paper, Aug. 2008, 52 pages.

(Continued)

*Primary Examiner* — Hoanganh Le
(74) *Attorney, Agent, or Firm* — Fenwick & West LLP

(57) ABSTRACT

A system for transmitting or receiving signals may include an integrated circuit (IC), a transducer operatively coupled to the IC for converting between electrical signals and electromagnetic signals; and insulating material that fixes the locations of the transducer and IC in spaced relationship relative to each other. The system may further include a lead frame providing external connections to conductors on the IC. An electromagnetic-energy directing assembly may be mounted relative to the transducer for directing electromagnetic energy in a region including the transducer and in a direction away from the IC. The directing assembly may include the lead frame, a printed circuit board ground plane, or external conductive elements spaced from the transducer. In a receiver, a signal-detector circuit may be responsive to a monitor signal representative of a received first radio-frequency electrical signal for generating a control signal that enables or disables an output from the receiver.

14 Claims, 7 Drawing Sheets

(51) Int. Cl.
*H01L 23/66* (2006.01)
*H01Q 7/00* (2006.01)
*H01Q 9/26* (2006.01)
*H01Q 1/48* (2006.01)
*H01Q 19/18* (2006.01)
*H01L 23/498* (2006.01)
*H01L 23/31* (2006.01)
*H01L 23/00* (2006.01)

(52) U.S. Cl.
CPC .......... *H01L 24/48* (2013.01); *H01L 24/49* (2013.01); *H01L 24/73* (2013.01); *H01L 2224/16225* (2013.01); *H01L 2224/16245* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/49113* (2013.01); *H01L 2224/73204* (2013.01); *H01L 2224/73265* (2013.01); *H01L 2924/09701* (2013.01); *H01L 2924/10253* (2013.01); *H01L 2924/13091* (2013.01); *H01L 2924/15311* (2013.01); *H01L 2924/181* (2013.01); *H01L 2924/3011* (2013.01); *H01L 2924/30111* (2013.01)

(56) References Cited

U.S. PATENT DOCUMENTS

| | | | |
|---|---|---|---|
| 3,971,930 | A | 7/1976 | Fitzmaurice et al. |
| 3,987,365 | A | 10/1976 | Okada et al. |
| 4,293,833 | A | 10/1981 | Popa |
| 4,485,312 | A | 11/1984 | Kusakabe et al. |
| 4,497,068 | A | 1/1985 | Fischer |
| 4,525,693 | A | 6/1985 | Suzuki et al. |
| 4,694,504 | A | 9/1987 | Porter et al. |
| 4,771,294 | A | 9/1988 | Wasilousky |
| 4,800,350 | A | 1/1989 | Bridges et al. |
| 4,875,026 | A | 10/1989 | Walter et al. |
| 4,946,237 | A | 8/1990 | Arroyo et al. |
| 5,164,942 | A | 11/1992 | Kamerman et al. |
| 5,199,086 | A | 3/1993 | Johnson et al. |
| 5,471,668 | A | 11/1995 | Soenen et al. |
| 5,543,808 | A | 8/1996 | Feigenbaum et al. |
| 5,621,913 | A | 4/1997 | Tuttle et al. |
| 5,749,052 | A | 5/1998 | Hidem et al. |
| 5,754,948 | A | 5/1998 | Metze |
| 5,773,878 | A | 6/1998 | Lim et al. |
| 5,786,626 | A | 7/1998 | Brady et al. |
| 5,861,782 | A | 1/1999 | Saitoh |
| 5,921,783 | A | 7/1999 | Fritsch et al. |
| 5,941,729 | A | 8/1999 | Sri-Jayantha |
| 5,943,374 | A | 8/1999 | Kokuryo et al. |
| 5,956,626 | A | 9/1999 | Kaschke et al. |
| 6,011,785 | A | 1/2000 | Carney |
| 6,072,433 | A | 6/2000 | Young et al. |
| 6,252,767 | B1 | 6/2001 | Carlson |
| 6,351,237 | B1 | 2/2002 | Martek et al. |
| 6,373,447 | B1 | 4/2002 | Rostoker et al. |
| 6,490,443 | B1 | 12/2002 | Freeny, Jr. |
| 6,492,973 | B1 | 12/2002 | Kuroki et al. |
| 6,534,784 | B2 | 3/2003 | Eliasson et al. |
| 6,542,720 | B1 | 4/2003 | Tandy |
| 6,590,544 | B1 | 7/2003 | Filipovic |
| 6,607,136 | B1 | 8/2003 | Alsman et al. |
| 6,647,246 | B1 | 11/2003 | Lu |
| 6,718,163 | B2 | 4/2004 | Tandy |
| 6,768,770 | B1 | 7/2004 | Lipperer |
| 6,803,841 | B2 | 10/2004 | Saitoh et al. |
| 6,915,529 | B1 | 7/2005 | Suematsu et al. |
| 6,967,347 | B2 | 11/2005 | Estes et al. |
| 7,050,763 | B2 | 5/2006 | Stengel et al. |
| 7,107,019 | B2 | 9/2006 | Tandy |
| 7,113,087 | B1 | 9/2006 | Casebolt et al. |
| 7,213,766 | B2 | 5/2007 | Ryan et al. |
| 7,311,526 | B2 | 12/2007 | Rohrbach et al. |
| 7,512,395 | B2 | 3/2009 | Beukema et al. |
| 7,517,222 | B2 | 4/2009 | Rohrbach et al. |
| 7,593,708 | B2 | 9/2009 | Tandy |
| 7,598,923 | B2 | 10/2009 | Hardacker et al. |
| 7,599,427 | B2 | 10/2009 | Bik |
| 7,612,630 | B2 | 11/2009 | Miller |
| 7,617,342 | B2 | 11/2009 | Rofougaran |
| 7,645,143 | B2 | 1/2010 | Rohrbach et al. |
| 7,656,205 | B2 | 2/2010 | Chen et al. |
| 7,664,461 | B2 | 2/2010 | Rofougaran et al. |
| 7,760,045 | B2 | 7/2010 | Kawasaki |
| 7,761,092 | B2 | 7/2010 | Desch et al. |
| 7,768,457 | B2 | 8/2010 | Pettus et al. |
| 7,769,347 | B2 | 8/2010 | Louberg et al. |
| 7,778,621 | B2 | 8/2010 | Tandy |
| 7,791,167 | B1 | 9/2010 | Rofougaran |
| 7,820,990 | B2 | 10/2010 | Schroeder et al. |
| 7,881,675 | B1 | 2/2011 | Gazdzinski |
| 7,881,753 | B2 | 2/2011 | Rofougaran |
| 7,889,022 | B2 | 2/2011 | Miller |
| 7,907,924 | B2 | 3/2011 | Kawasaki |
| 7,929,474 | B2 | 4/2011 | Pettus et al. |
| 7,975,079 | B2 | 7/2011 | Bennett et al. |
| 8,013,610 | B1 | 9/2011 | Merewether et al. |
| 8,014,416 | B2 | 9/2011 | Ho et al. |
| 8,023,886 | B2 | 9/2011 | Rofougaran |
| 8,036,629 | B2 | 10/2011 | Tandy |
| 8,041,227 | B2 | 10/2011 | Holcombe et al. |
| 8,063,769 | B2 | 11/2011 | Rofougaran |
| 8,081,699 | B2 | 12/2011 | Siwiak et al. |
| 8,087,939 | B2 | 1/2012 | Rohrbach et al. |
| 8,121,542 | B2 | 2/2012 | Zack et al. |
| 8,131,645 | B2 | 3/2012 | Lin et al. |
| 8,183,935 | B2 | 5/2012 | Milano et al. |
| 8,244,175 | B2 | 8/2012 | Rofougaran |
| 8,244,179 | B2 | 8/2012 | Dua |
| 8,279,611 | B2 | 10/2012 | Wong et al. |
| 8,339,258 | B2 | 12/2012 | Rofougaran |
| 8,346,847 | B2 | 1/2013 | Steakley |
| 8,422,482 | B2 | 4/2013 | Sugita |
| 8,554,136 | B2 | 10/2013 | McCormack |
| 8,634,767 | B2 | 1/2014 | Rofougaran et al. |
| 8,755,849 | B2 | 6/2014 | Rofougaran et al. |
| 8,794,980 | B2 | 8/2014 | McCormack |
| 8,812,833 | B2 | 8/2014 | Liu et al. |
| 8,939,773 | B2 | 1/2015 | McCormack |
| 2002/0008665 | A1 | 1/2002 | Takenoshita |
| 2002/0027481 | A1 | 3/2002 | Fiedziuszko |
| 2002/0058484 | A1 | 5/2002 | Bobier et al. |
| 2002/0106041 | A1 | 8/2002 | Chang et al. |
| 2002/0118083 | A1 | 8/2002 | Pergande |
| 2002/0140584 | A1 | 10/2002 | Maeda et al. |
| 2003/0025626 | A1 | 2/2003 | McEwan |
| 2003/0088404 | A1 | 5/2003 | Koyanagi |
| 2003/0137371 | A1 | 7/2003 | Saitoh et al. |
| 2004/0043734 | A1 | 3/2004 | Hashidate |
| 2004/0160294 | A1 | 8/2004 | Elco |
| 2004/0214621 | A1 | 10/2004 | Ponce De Leon et al. |
| 2005/0032474 | A1 | 2/2005 | Gordon |
| 2005/0099242 | A1 | 5/2005 | Sano |
| 2005/0109841 | A1 | 5/2005 | Ryan et al. |
| 2005/0124307 | A1 | 6/2005 | Ammar |
| 2005/0140436 | A1 | 6/2005 | Ichitsubo et al. |
| 2006/0003710 | A1 | 1/2006 | Nakagawa et al. |
| 2006/0029229 | A1 | 2/2006 | Trifonov et al. |
| 2006/0038168 | A1 | 2/2006 | Estes et al. |
| 2006/0051981 | A1 | 3/2006 | Neidlein et al. |
| 2006/0077043 | A1 | 4/2006 | Amtmann et al. |
| 2006/0082518 | A1 | 4/2006 | Ram |
| 2006/0128372 | A1 | 6/2006 | Gazzola |
| 2006/0140305 | A1 | 6/2006 | Netsell et al. |
| 2006/0159158 | A1 | 7/2006 | Moore et al. |
| 2006/0258289 | A1 | 11/2006 | Dua |
| 2006/0276157 | A1 | 12/2006 | Chen et al. |
| 2007/0010295 | A1 | 1/2007 | Greene |
| 2007/0024504 | A1 | 2/2007 | Matsunaga |
| 2007/0035917 | A1 | 2/2007 | Hotelling et al. |

(56) References Cited

U.S. PATENT DOCUMENTS

| | | |
|---|---|---|
| 2007/0063056 A1 | 3/2007 | Gaucher et al. |
| 2007/0147425 A1 | 6/2007 | Lamoureux et al. |
| 2007/0229270 A1 | 10/2007 | Rofougaran |
| 2007/0242621 A1 | 10/2007 | Nandagopalan et al. |
| 2007/0273476 A1 | 11/2007 | Yamazaki et al. |
| 2007/0278632 A1 | 12/2007 | Zhao et al. |
| 2008/0002652 A1 | 1/2008 | Gupta et al. |
| 2008/0055093 A1 | 3/2008 | Shkolnikov et al. |
| 2008/0055303 A1 | 3/2008 | Ikeda |
| 2008/0089667 A1 | 4/2008 | Grady et al. |
| 2008/0112101 A1 | 5/2008 | McElwee et al. |
| 2008/0142250 A1 | 6/2008 | Tang |
| 2008/0143435 A1 | 6/2008 | Wilson et al. |
| 2008/0150799 A1 | 6/2008 | Hemmi et al. |
| 2008/0150821 A1 | 6/2008 | Koch et al. |
| 2008/0159243 A1 | 7/2008 | Rofougaran |
| 2008/0165002 A1 | 7/2008 | Tsuji |
| 2008/0165065 A1 | 7/2008 | Hill et al. |
| 2008/0192726 A1 | 8/2008 | Mahesh et al. |
| 2008/0195788 A1 | 8/2008 | Tamir et al. |
| 2008/0197973 A1 | 8/2008 | Enguent |
| 2008/0238632 A1 | 10/2008 | Endo et al. |
| 2008/0289426 A1 | 11/2008 | Kearns et al. |
| 2008/0290959 A1 | 11/2008 | Ali et al. |
| 2008/0293446 A1 | 11/2008 | Rofougaran |
| 2009/0006677 A1 | 1/2009 | Rofougaran |
| 2009/0009337 A1 | 1/2009 | Rofougaran |
| 2009/0015353 A1 | 1/2009 | Rofougaran |
| 2009/0028177 A1 | 1/2009 | Pettus et al. |
| 2009/0029659 A1 | 1/2009 | Gonzalez |
| 2009/0033455 A1 | 2/2009 | Strat et al. |
| 2009/0037628 A1 | 2/2009 | Rofougaran |
| 2009/0073070 A1 | 3/2009 | Rofougaran |
| 2009/0075688 A1 | 3/2009 | Rofougaran |
| 2009/0086844 A1 | 4/2009 | Rofougaran |
| 2009/0091486 A1 | 4/2009 | Wiesbauer et al. |
| 2009/0094506 A1 | 4/2009 | Lakkis |
| 2009/0098826 A1 | 4/2009 | Zack et al. |
| 2009/0110131 A1 | 4/2009 | Bornhoft et al. |
| 2009/0111390 A1 | 4/2009 | Sutton et al. |
| 2009/0175323 A1 | 7/2009 | Chung |
| 2009/0180408 A1 | 7/2009 | Graybeal et al. |
| 2009/0189873 A1 | 7/2009 | Peterson et al. |
| 2009/0218407 A1 | 9/2009 | Rofougaran |
| 2009/0218701 A1 | 9/2009 | Rofougaran |
| 2009/0236701 A1 | 9/2009 | Sun et al. |
| 2009/0237317 A1 | 9/2009 | Rofougaran |
| 2009/0239392 A1 | 9/2009 | Sumitomo et al. |
| 2009/0239483 A1 | 9/2009 | Rofougaran |
| 2009/0245808 A1 | 10/2009 | Rofougaran |
| 2009/0257445 A1 | 10/2009 | Chan et al. |
| 2009/0280765 A1 | 11/2009 | Rofougaran et al. |
| 2009/0310649 A1 | 12/2009 | Fisher et al. |
| 2010/0009627 A1 | 1/2010 | Huomo |
| 2010/0071031 A1 | 3/2010 | Carter et al. |
| 2010/0103045 A1 | 4/2010 | Liu et al. |
| 2010/0120406 A1 | 5/2010 | Banga et al. |
| 2010/0127804 A1 | 5/2010 | Vouloumanos |
| 2010/0149149 A1 | 6/2010 | Lawther |
| 2010/0159829 A1 | 6/2010 | McCormack |
| 2010/0167645 A1 | 7/2010 | Kawashimo |
| 2010/0202345 A1 | 8/2010 | Jing et al. |
| 2010/0202499 A1 | 8/2010 | Lee et al. |
| 2010/0203833 A1 | 8/2010 | Dorsey |
| 2010/0231452 A1 | 9/2010 | Babakhani et al. |
| 2010/0260274 A1 | 10/2010 | Yamada et al. |
| 2010/0265648 A1 | 10/2010 | Hirabayashi |
| 2010/0277394 A1 | 11/2010 | Haustein et al. |
| 2010/0282849 A1 | 11/2010 | Mair |
| 2010/0283700 A1 | 11/2010 | Rajanish et al. |
| 2010/0285634 A1 | 11/2010 | Rofougaran |
| 2010/0297954 A1 | 11/2010 | Rofougaran et al. |
| 2010/0315954 A1 | 12/2010 | Singh et al. |
| 2011/0009078 A1 | 1/2011 | Kawamura |
| 2011/0012727 A1 | 1/2011 | Pance et al. |
| 2011/0038282 A1 | 2/2011 | Mihota et al. |
| 2011/0044404 A1 | 2/2011 | Vromans |
| 2011/0047588 A1 | 2/2011 | Takeuchi et al. |
| 2011/0050446 A1 | 3/2011 | Anderson et al. |
| 2011/0084398 A1 | 4/2011 | Pilard et al. |
| 2011/0092212 A1 | 4/2011 | Kubota |
| 2011/0122932 A1 | 5/2011 | Lovberg |
| 2011/0127954 A1 | 6/2011 | Walley et al. |
| 2011/0181484 A1 | 7/2011 | Pettus et al. |
| 2011/0197237 A1 | 8/2011 | Turner |
| 2011/0207425 A1 | 8/2011 | Juntunen et al. |
| 2011/0221582 A1 | 9/2011 | Chuey et al. |
| 2011/0249659 A1 | 10/2011 | Fontaine et al. |
| 2011/0250928 A1 | 10/2011 | Schlub et al. |
| 2011/0285606 A1 | 11/2011 | De Graauw et al. |
| 2011/0286703 A1 | 11/2011 | Kishima et al. |
| 2011/0292972 A1* | 12/2011 | Budianu et al. ............... 375/138 |
| 2011/0311231 A1 | 12/2011 | Ridgway et al. |
| 2012/0009880 A1 | 1/2012 | Trainin et al. |
| 2012/0013499 A1 | 1/2012 | Hayata |
| 2012/0028582 A1 | 2/2012 | Tandy |
| 2012/0064664 A1 | 3/2012 | Yamazaki et al. |
| 2012/0069772 A1 | 3/2012 | Byrne et al. |
| 2012/0072620 A1 | 3/2012 | Jeong et al. |
| 2012/0082194 A1 | 4/2012 | Tam et al. |
| 2012/0083137 A1 | 4/2012 | Rohrbach et al. |
| 2012/0091799 A1 | 4/2012 | Rofougaran et al. |
| 2012/0110635 A1 | 5/2012 | Harvey et al. |
| 2012/0126794 A1 | 5/2012 | Jensen et al. |
| 2012/0139768 A1 | 6/2012 | Loeda et al. |
| 2012/0219039 A1* | 8/2012 | Feher ............................ 375/219 |
| 2012/0249366 A1 | 10/2012 | Pozgay et al. |
| 2012/0263244 A1 | 10/2012 | Kyles et al. |
| 2012/0265596 A1 | 10/2012 | Mazed et al. |
| 2012/0286049 A1 | 11/2012 | McCormack et al. |
| 2012/0290760 A1 | 11/2012 | McCormack et al. |
| 2012/0295539 A1 | 11/2012 | McCormack et al. |
| 2012/0307932 A1 | 12/2012 | McCormack et al. |
| 2012/0319496 A1 | 12/2012 | McCormack et al. |
| 2012/0319890 A1 | 12/2012 | McCormack et al. |
| 2013/0070817 A1 | 3/2013 | McCormack et al. |
| 2013/0106673 A1 | 5/2013 | McCormack et al. |
| 2013/0109303 A1 | 5/2013 | McCormack et al. |
| 2013/0157477 A1 | 6/2013 | McCormack |
| 2013/0183903 A1 | 7/2013 | McCormack et al. |
| 2013/0196598 A1 | 8/2013 | McCormack et al. |
| 2013/0257670 A1 | 10/2013 | Sovero et al. |
| 2013/0278360 A1 | 10/2013 | Kim et al. |
| 2013/0316653 A1 | 11/2013 | Kyles et al. |
| 2014/0038521 A1 | 2/2014 | McCormack |
| 2014/0043208 A1 | 2/2014 | McCormack et al. |
| 2014/0148193 A1 | 5/2014 | Kogan et al. |
| 2014/0266331 A1 | 9/2014 | Arora |
| 2014/0269414 A1 | 9/2014 | Hyde et al. |
| 2015/0111496 A1 | 4/2015 | McCormack et al. |

FOREIGN PATENT DOCUMENTS

| | | |
|---|---|---|
| CN | 2313296 Y | 4/1999 |
| CN | 1781255 A | 5/2006 |
| CN | 101090179 A | 12/2007 |
| CN | 101496298 A | 7/2009 |
| CN | 201562854 U | 8/2010 |
| EP | 0152246 A2 | 8/1985 |
| EP | 0 515 187 A2 | 11/1992 |
| EP | 0515187 A2 | 11/1992 |
| EP | 0789421 A2 | 8/1997 |
| EP | 0884799 A2 | 12/1998 |
| EP | 0896380 A2 | 2/1999 |
| EP | 0996189 A2 | 4/2000 |
| EP | 1041666 A1 | 10/2000 |
| EP | 1 298 809 A2 | 4/2003 |
| EP | 1357395 A1 | 10/2003 |
| EP | 1798867 A2 | 6/2007 |
| EP | 2106192 A2 | 9/2009 |
| EP | 2 309 608 A1 | 4/2011 |
| EP | 2328226 A1 | 6/2011 |
| EP | 2 360 923 A1 | 8/2011 |
| GB | 817349 | 7/1959 |

(56) References Cited

FOREIGN PATENT DOCUMENTS

| | | |
|---|---|---|
| GB | 2217114 | 10/1989 |
| JP | 52-72502 A | 6/1977 |
| JP | 5-236031 A | 9/1993 |
| JP | 5-327788 A | 12/1993 |
| JP | 07-006817 A | 1/1995 |
| JP | 9-83538 A | 3/1997 |
| JP | 10-13296 A | 1/1998 |
| JP | H10-065568 A | 3/1998 |
| JP | H11-298343 A | 10/1999 |
| JP | 2000-022665 A | 1/2000 |
| JP | 2001-153963 A | 6/2001 |
| JP | 2001-326506 A | 11/2001 |
| JP | 2002-261514 A | 9/2002 |
| JP | 2002-265729 A | 9/2002 |
| JP | 2003-209511 A | 7/2003 |
| JP | 2004-505505 A | 2/2004 |
| JP | 2005-117153 A | 4/2005 |
| JP | 2008-022247 A | 1/2008 |
| JP | 2008-079241 | 4/2008 |
| JP | 2008-124917 A | 5/2008 |
| JP | 2008-129919 A | 6/2008 |
| JP | 2008-250713 A | 10/2008 |
| JP | 2008 252566 A | 10/2008 |
| JP | 2008252566 A | 10/2008 |
| JP | 2009-231114 | 7/2009 |
| JP | 2009-239842 A | 10/2009 |
| JP | 2010-183055 A | 8/2010 |
| JP | 2010-531035 A | 9/2010 |
| JP | 2011-022640 A | 2/2011 |
| JP | 2011-41078 A | 2/2011 |
| JP | 2011-044944 A | 3/2011 |
| JP | 2011-176672 A | 9/2011 |
| JP | 2014-516221 | 7/2014 |
| WO | 97/32413 | 9/1997 |
| WO | WO 97/32413 A | 9/1997 |
| WO | WO 2006/133108 A2 | 12/2006 |
| WO | WO 2009/113373 A1 | 9/2009 |
| WO | 2011/114737 A1 | 9/2011 |
| WO | 2011/114738 A1 | 9/2011 |
| WO | WO 2011/114737 A1 | 9/2011 |
| WO | WO 2011/114738 A1 | 9/2011 |
| WO | WO 2012/129426 A3 | 9/2012 |
| WO | 2012/155135 A3 | 11/2012 |
| WO | WO 2012/154550 A1 | 11/2012 |
| WO | WO 2012/155135 A3 | 11/2012 |
| WO | 2012/166922 A1 | 12/2012 |
| WO | 2012/174350 A1 | 12/2012 |
| WO | WO 2012/166922 A1 | 12/2012 |
| WO | WO 2012/174350 A1 | 12/2012 |
| WO | 2013/006641 A3 | 1/2013 |
| WO | WO 2013/006641 A3 | 1/2013 |
| WO | 2013/040396 A1 | 3/2013 |
| WO | WO 2013/040396 A1 | 3/2013 |
| WO | 2013/059801 A1 | 4/2013 |
| WO | 2013/059802 A1 | 4/2013 |
| WO | WO 2013/059801 A1 | 4/2013 |
| WO | WO 2013/059802 A1 | 4/2013 |
| WO | 2013/090625 A1 | 6/2013 |
| WO | WO 2013/090625 A1 | 6/2013 |
| WO | WO 2013/131095 A1 | 9/2013 |
| WO | WO 2013/134444 A1 | 9/2013 |
| WO | WO 2014/026191 A1 | 2/2014 |

OTHER PUBLICATIONS

Murcia Martinez, J., Authorized Officer, European Patent Office, "International Search Report" in connection with related Application Serial No. PCT/US2012/040214, dated Aug. 21, 2012, 3 pages.
Murcia Martinez, J., Authorized Officer, European Patent Office, "Written Opinion of the International Searching Authority" in connection with related Application Serial PCT/US2012/040214, dated Aug. 21, 2012, 8 pages.
Ablerga, Vito, Authorized Officer, European Patent Office, "International Search Report" in connection with related Application Serial No. PCT/US2012/042616,, dated Oct. 1, 2012, 4 pages.
Ablerga, Vito, Authorized Officer, European Patent Office, "Written Opinion of the International Searching Authority" in connection with related Application Serial No. PCT/US2012/042616,, dated Oct. 1, 2012, 10 pages.
Cortes Rosa, Joao, Authorized Officer, European Patent Office, "International Search Report" in connection with related Application No. PCT/US2012/030166, dated Oct. 31, 2010, 6 pages.
Cortes Rosa, Joao, Authorized Officer, European Patent Office, "Written Opinion of the International Searching Authority" in connection with related Application No. PCT/US2012/030166, dated Oct. 31, 2010, 9 pages.
Helms, Jochen, Authorized Officer, European Patent Office, "International Search Report" in connection with related Application No. PCT/US2012/055488, dated Dec. 13, 2012, 4 pages.
Helms, Jochen, Authorized Officer, European Patent Office, "Written Opinion of the International Searching Authority" in connection with related Application No. PCT/US2012/055488, dated Dec. 13, 2012, 8 pages.
Helms, Jochen, Authorized Officer, European Patent Office, "International Search Report" in connection with related Application No. PCT/US2012/045444, dated Jan. 21, 2013, 7 pages.
Helms, Jochen, Authorized Officer, European Patent Office, "Written Opinion of the International Searching Authority" in connection with related Application No. PCT/US2012/045444, dated Jan. 21, 2013, 9 pages.
Helms, Jochen, Authorized Officer, European Patent Office, "International Search Report" in connection with related Application No. PCT/US2012/037795, dated Jan. 21, 2013, 7 pages.
Helms, Jochen, Authorized Officer, European Patent Office, "Written Opinion of the International Searching Authority" in connection with related Application No. PCT/US2012/037795, dated Jan. 21, 2013, 12 pages.
Helms, Jochen, Authorized Officer, European Patent Office, "International Search Report" in connection with related Application No. PCT/US2012/061345, dated Jan. 24, 2013, 4 pages.
Helms, Jochen, Authorized Officer, European Patent Office, "Written Opinion of the International Searching Authority" in connection with related Application No. PCT/US2012/061345, dated Jan. 24, 2013, 7 pages.
Franz, Volker, Authorized Officer, European Patent Office, "International Search Report" in connection with related Application No. PCT/US2012/061346, dated Jan. 24, 2013, 5 pages.
Franz, Volker, Authorized Officer, European Patent Office, "Witten Opinion of the International Searching Authority" in connection with related Application No. PCT/US2012/061346, dated Jan. 24, 2013, 9 pages.
Bouhana, Emmanuel, Authorized Officer, European Patent Office, "International Search Report" in connection with related Application No. PCT/US2012/069576, dated May 2, 2013, 3 pages.
Bouhana, Emmanuel, Authorized Officer, European Patent Office, "Written Opinion of the International Searching Authority" in connection with related Application No. PCT/US2012/069576, dated May 2, 2013, 13 pages.
Future Technology Devices International Limited (FTDI), "Technical Note TN_113 Simplified Description of USB Device Enumeration", Doc. Ref. No. FT_000180, Version 1.0, Issue Date Oct. 28, 2009, 19 pages.
Lee W. Young, Authorized Officer, U.S. Patent and Trademark Office, "International Search Report" in connection with related PCT Patent App. No. PCT/US2013/027835, dated May 3, 2013, 4 pages.
Lee W. Young, Authorized Officer, U.S. Patent and Trademark Office, "Written Opinion of the International Searching Authority" in connection with related PCT Patent App. No. PCT/US2013/027835, dated May 3, 2013, 8 pages.
Márquez, T. López, Authorized Officer, European Patent Office, "International Search Report" in connection with related PCT Patent App. No. PCT/US2013/029469, dated Jun. 6, 2013, 5 pages.
Márquez, T. López, Authorized Officer, European Patent Office, "Written Opinion of the International Searching Authority" in connection with related PCT Patent App. No. PCT/US2013/029469, dated Jun. 6, 2013, 5 pages.

(56) References Cited

OTHER PUBLICATIONS

Jochen Helms, Authorized Officer, European Patent Office, "International Search Report" in connection with related PCT Patent App. No. PCT/US2013/023665, dated Jun. 20, 2013, 5 pages.
Jochen Helms, Authorized Officer, European Patent Office, "Written Opinion of the International Searching Authority" in connection with related PCT Patent App. No. PCT/US2013/023665, dated Jun. 20, 2013, 10 pages.
Japanese Patent Office, "Notice of Reasons for Rejection" in connection with related Japanese Patent Application No. 2014-501249, dated Jul. 22, 2014, 3 pages.
Bluetooth Audio Dongle Receiver 3.5mm Stereo, Feb. 8, 2013.
Bluetooth Headset, Jabra clipper, Jul 28, 2010.
Chinese Office Action, Chinese Application No. 201280025060.8, Oct. 30, 2014, 8 pages (with concise explanation of relevance).
ECMA Standard: "Standard ECMA-398: Close Proximity Electric Induction Wireless Communications," Jun. 1, 2011, pp. 1-100, May be retrieved from the Internet<URL:http://www.ecma-international.org/publications/standards/Ecma-398.htm>.
Enumeration: How the Host Learns about Devices, Jan Axelson's Lakeview Research.
Future Technology Devices Interntional Limited (FTDI) "Technical Note TN_I 13 Simplified Description ofUSB Device Enumeration", Doc. Ref. No. FT_000180, Version 1.0, Issue Date Oct. 28, 2009, 19 pages.
Goldstone , L. L., "MM Wave Transmission Polarizer", International Symposium Digest—Antennas & Propagation vol. 2, Jun. 1979, 5 pages.
Japanese Office Action, Japanese Patent Office, "Notice of Reasons for Rejection" in connection with related Japanese Patent Application No. 2014-501249, dated Jul. 22, 2014, 7 pages.
Japanese Office Action, Japanese Application No. 2014-513697, Jan. 20, 2015, 7 pages.
Juntunen, E. A., "60 GHz CMOS Pico-Joule/Bit Oook Receiver Design for Multi-Gigabit Per Second Wireless Communications" thesis paper, Aug. 2008, 52 pages.
Korean Office Action, Korean Application No. 10-2013-7027865, Oct. 22, 2014, 12 pages.
Office of Engineering and Technology Federal Communications Commission, "Understanding the FCC Regulations for Low-Power, Non-Licensed Transmitters", OET Bulletin No. 63, Oct. 1993, 34 pages.
PCM510x 2VRMS DirectPath™, 112/106/lOOdB Audio Stereo DAC with 32-bit, 384kHz PCM Interface by Texas Instruments.
PCT International Search Report, PCT Patent Application No. PCT/US2013/027835, dated May 3, 2013, 4 pages.
PCT Written Opinion, PCT Patent Application No. PCT/US2013/027835, May 3, 2013, 8 pages.
PCT International Search Report, PCT Patent Application No. PCT/US2013/029469, Jun. 6, 2013, 5 pages.
PCT Written Opinion, PCT Patent Application No. PCT/US2013/029469, Jun. 6, 2013, 5 pages.
PCT International Search Report, PCT Patent Application No. PCT/US2013/023665, Jun. 20, 2013, 5 pages.
PCT Written Opinion, PCT Patent Application No. PCT/US2013/023665, Jun. 20, 2013, 10 pages.
PCT International Search Report, PCT Patent Application No. PCT/US2012/040214, Aug. 21, 2012, 3 pages.
PCT Written Opinion, PCT Patent Application No. PCT/US2012/040214, Aug. 21, 2012, 8 pages.
PCT International Search Report, PCT Patent Application No. PCT/US2012/042616, Oct. 1, 2012, 4 pages.
PCT Written Opinion, PCT Patent Application No. PCT/US2012/042616, Oct. 1, 2012, 10 pages.
PCT International Search Report, PCT Patent Application No. PCT/US2012/030166, Oct. 31, 2010, 6 pages.
PCT Written Opinion, PCT Patent Application No. PCT/US2012/030166, Oct. 31, 2010, 9 pages.
PCT International Search Report, PCT Patent Application No. PCT/US2012/055488, Dec. 13, 2012, 4 pages.
PCT Written Opinion, PCT Patent Application No. PCT/US2012/055488, Dec. 13, 2012, 8 pages.
PCT International Search Report, PCT Patent Application No. PCT/US2012/045444, Jan. 21, 2013, 7 pages.
PCT Written Opinion, PCT Patent Application No. PCT/US2012/045444, Jan. 21, 2013, 9 pages.
PCT International Search Report, PCT Patent Application No. PCT/US2012/037795, Jan. 21, 2013, 7 pages.
PCT Written Opinion, PCT Patent Application No. PCT/US2012/037795, Jan. 21, 2013, 12 pages.
PCT International Search Report, PCT Patent Application No. PCT/US2012/061345, Jan. 24, 2013, 4 pages.
PCT Written Opinion, PCT Patent Application No. PCT/US2012/061345, Jan. 24, 2013, 7 pages.
PCT International Search Report, PCT Patent Application No. PCT/US2012/061346, Jan. 24, 2013, 5 pages.
PCT Written Opinion, PCT Patent Application No. PCT/US2012/061346, Jan. 24, 2013, 9 pages.
PCT International Search Report, PCT Patent Application No. PCT/US2012/069576, May 2, 2013, 3 pages.
PCT Written Opinion, PCT Patent Application No. PCT/US2012/069576, May 2, 2013, 13 pages.
PCT International Search Report, PCT Patent Application No. PCT/US2013/028896, Sep. 26, 2013, 4 pages.
PCT Written Opinion, PCT Patent Application No. PCT/US2013/028896, Sep. 26, 2013, 4 pages.
PCT International Search Report, PCT Patent Application No. PCT/US2013/046631, Sep. 20, 2013, 4 pages.
PCT Written Opinion, PCT Patent Application No. PCT/US2013/046631, Sep. 20, 2013, 6 pages.
PCT International Search Report, PCT Patent Application No. PCT/US2013/054292, Nov. 29, 2013, 4 pages.
PCT Written Opinion, PCT Patent Application No. PCT/US2013/054292, Nov. 29, 2013, 7 pages.
PCT International Search Report and Written Opinion, PCT Application No. PCT/US2014/024027, Jul. 21, 2014, 15 pages.
PCT International Search Report, PCT Application No. PCT/US2013/075222, Jul. 17, 2014, 4 pages.
PCT Written Opinion, PCT Application No. PCT/US2013/075222, Jul. 17, 2014, 8 pages.
PCT International Search Report, PCT Application No. PCT/US2013/075892, Apr. 23, 2014, 4 pages.
PCT Written Opinion, PCT Application No. PCT/US2013/075892, Apr. 23, 2014, 8 pages.
PCT International Search Report and Written Opinion, PCT Application No. PCT/US2013/033394, Aug. 8, 2013, 10 pages.
PCT International Search Report and Written Opinion, PCT Application No. PCT/US2013/055487, Jan. 24, 2014, 9 pages.
PCT International Search Report and Written Opinion, PCT Application No. PCT/US2013/076687, May 21, 2014, 20 pages.
PCT International Search Report and Written Opinion, PCT Application No. PCT/US2014/030115, Sep. 22, 2014, 15 pages.
PCT International Search Report and Written Opinion, PCT Application No. PCT/US2013/059811, Dec. 2, 2013, 11 pages.
Philips, l2S Bus Specification, Jun. 5, 1996.
RF Power Amplifier, Mar. 22, 2008, 1 page, May be Retrieved at <http://en.wikipedia.org/wiki/RF_power_amplifier>.
Silicon Labs USB-to-12S Audio Bridge Chip Brings Plug-and-Play Simplicity to Audio Design, Cision Wire, Feb. 4, 2013.
TN21065L_l25, Interfacing l2S-Compatible Audio Devices to the ADSP-21065L Serial Ports, Apr. 1999.
USB in a NutShell . . . (43 pages).
USB Made Simple, MQP Electronics Ltd, 2006-2008 (78 pages).
"Understanding the FCC Regulations for Low-Power Non-Licensed Transmitters", Office of Engineering and Technology, Federal Communications Commission, OET Bulletin No. 63, Oct. 1993.
Universal Serial Bus, Wikipedia, 2012 (32 pages).
Vahle Electrification Systems, "CPS Contactless Power System", Catalog No. 9d/E, 2004, 12 pages.
Wireless HD: "WirelessHD Specification Version 1.1 Overview," May 1, 2010, pp. 1-95, May be retrieved from the Internet<URL:http://www.wirelesshd.org/pdfs/WirelessHD-Specification-Overview-v1.1May2010.pdf>.

(56) References Cited

OTHER PUBLICATIONS

United States Office Action, U.S. Appl. No. 13/485,306, Sep. 26, 2013, 11 pages.
United States Office Action, U.S. Appl. No. 13/541,543, Feb. 12, 2015, 25 pages.
United States Office Action, U.S. Appl. No. 13/541,543, Oct. 28, 2014, 42 pages.
United States Office Action, U.S. Appl. No. 13/524,956, Feb. 9, 2015, 17 pages.
United States Office Action, U.S. Appl. No. 13/524,963, Mar. 17, 2014, 14 pages.
United States Office Action, U.S. Appl. No. 13/657,482, Jan. 2, 2015, 29 pages.
United States Office Action, U.S. Appl. No. 12/655,041, Jun. 7, 2013, 9 pages.
United States Office Action, U.S. Appl. No. 14/047,924, Dec. 19, 2014, 8 pages.
United States Office Action, U.S. Appl. No. 14/047,924, Feb. 27, 2014, 9 pages.
United States Office Action, U.S. Appl. No. 13/784,396, Sep. 11, 2014, 7 pages.
United States Office Action, U.S. Appl. No. 13/760,089, Jul. 7, 2014, 14 pages.
United States Office Action, U.S. Appl. No. 14/596,172, Feb. 10, 2015, 7 pages.
United States Office Action, U.S. Appl. No. 14/462,560, Feb. 13, 2015, 12 pages.
United States Office Action, U.S. Appl. No. 14/026,913, Feb. 25, 2015, 15 pages.
Japanese Office Action, Japanese Application No. 2014-519270, Mar. 9, 2015, 17 pages.
Japanese Office Action, Japanese Application No. 2014-547442, May 25, 2015, 7 pages.
Korean Office Action, Korean Application No. 10-2013-7027865, Apr. 13, 2015, 8 pages.
Li, X. et al., "Space-Time Transmissions for Wireless Secret-Key Agreement with Information-Theoretic Secrecy," IEEE, 2003, pp. 1-5.
United States Office Action, U.S. Appl. No. 14/135,458, Apr. 13, 2015, 13 pages.
United States Office Action, U.S. Appl. No. 13/541,543, May 28, 2015, 17 pages.
United States Office Action, U.S. Appl. No. 14/047,924, May 21, 2015, 6 pages.
United States Office Action, U.S. Appl. No. 14/026,913, Jun. 5, 2015, 16 pages.
Chinese Second Office Action, Chinese Application No. 201280025060.8, Jun. 11, 2015, 8 pages.
United States Office Action, U.S. Appl. No. 13/922,062, Jul. 23, 2015, 10 pages.
European Examination Report, European Application No. 13711499.7, Oct. 5, 2015, 8 pages.
Japanese Office Action, Japanese Application No. 2015-004839, Aug. 10, 2015, 12 pages.
United States Office Action, U.S. Appl. No. 13/963,199, Jul. 27, 2015, 9 pages.
United States Office Action, U.S. Appl. No. 14/109,938, Aug. 14, 2015, 12 pages.
United States Office Action, U.S. Appl. No. 14/026,913, Sep. 18, 2015, 9 pages.
United States Office Action, U.S. Appl. No. 13/657,482, Sep. 22, 2015, 24 pages.
Chinese First Office Action, Chinese Application 201280043190.4, Jan. 21, 2015, 18 pages.
Chinese Second Office Action, Chinese Application No. 201280043190.4, Oct. 26, 2015, 5 pages.
Chinese First Office Action, Chinese Application No. 201280038180.1, Dec. 1, 2015, 16 pages.
Chinese Third Office Action, Chinese Application No. 201280025060.8, Dec. 28, 2015, 6 pages.
Chinese First Office Action, Chinese Application No. 201280062118.6, Jan. 5, 2016, 15 pages.
Chinese First Office Action, Chinese Application No. 201380055859.6, Jan. 20, 2016, 5 pages.
Chinese First Office Action, Chinese Application No. 201380048407.5, Feb. 3, 2016, 14 pages.
Japanese Office Action, Japanese Application No. 2014-513697, Nov. 2, 2015, 5 pages.
United States Office Action, U.S. Appl. No. 14/215,069, Oct. 30, 2015, 15 pages.
United States Office Action, U.S. Appl. No. 14/047,924, Nov. 18, 2015, 7 pages.
United States Office Action, U.S. Appl. No. 14/881,901, Dec. 17, 2015, 15 pages.
United States Office Action, U.S. Appl. No. 13/541,543, Dec. 21, 2015, 20 pages.
European Examination Report, European Application No. 13821032.3, Apr. 4, 2016, 3 pages.
Ingerski, J., "Mobile Tactical Communications, The Role of the UHF Follow-On Satellite Constellation and Its Successor, Mobile User Objective System," IEEE, 2002, pp. 302-306.
Japanese Office Action, Japanese Application No. 2014/547442, Mar. 14, 2016, 8 pages.
Taiwan Office Action, Taiwan Application No. 101110057, Mar. 23, 2016, 7 pages.
United States Office Action, U.S. Appl. No. 14/936,877, Mar. 23, 2016, 15 pages.
Taiwan Office Action, Taiwan Application No. 101147406, Mar. 23, 2016, 6 pages.
Japenese Office Action, Japanese Application No. 2015-004839, May 16, 2016, 10 pages.
Chinese Fourth Office Action, Chinese Application No. 201280025060.8, Jun. 17, 2016, 9 pages.

* cited by examiner

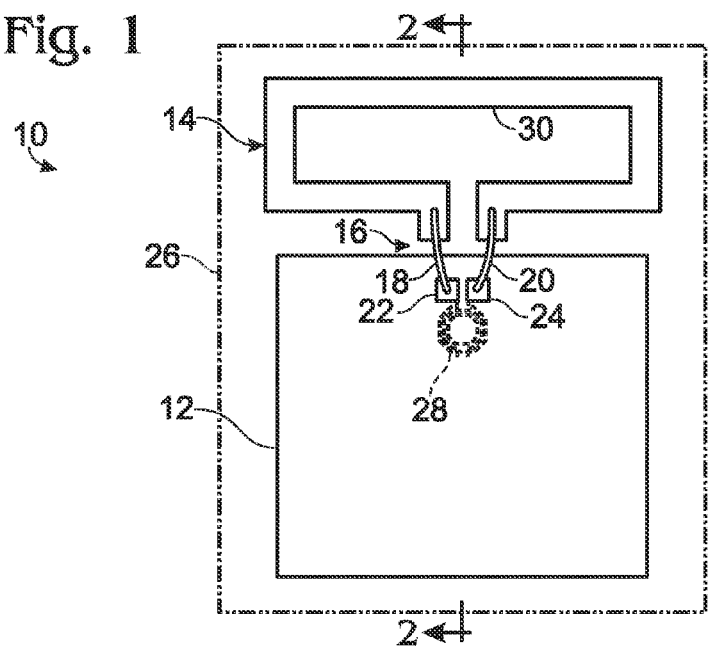
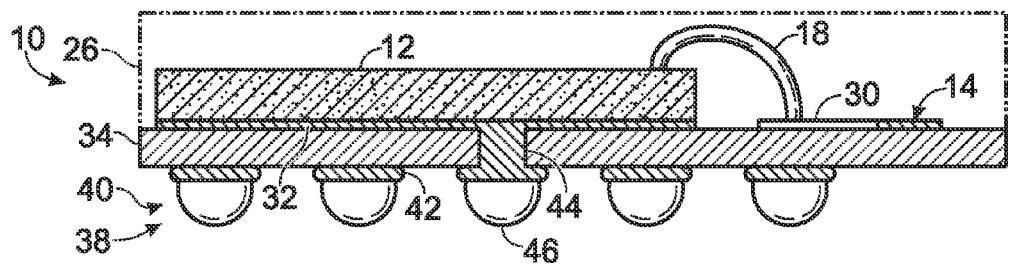
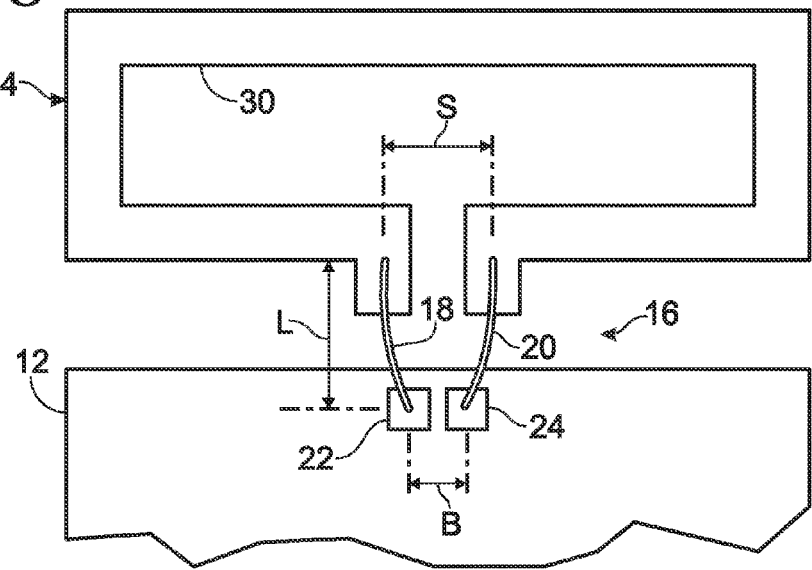

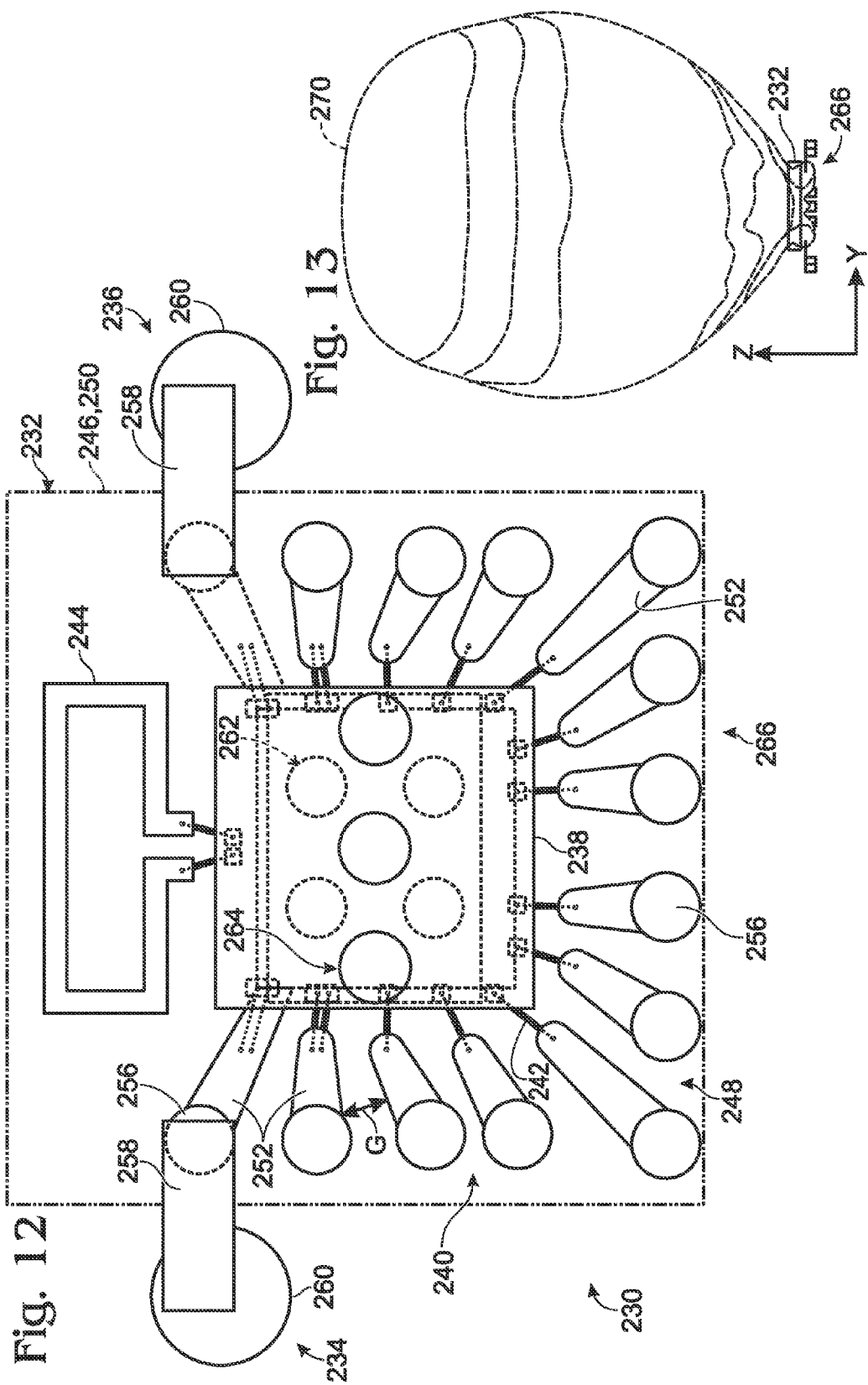

INTEGRATED CIRCUIT WITH ELECTROMAGNETIC COMMUNICATION

CROSS-REFERENCE TO RELATED APPLICATIONS

This application claims the benefit of U.S. Provisional Application No. 61/467,334, filed Mar. 24, 2011, which application is incorporated herein by reference in its entirety for all purposes.

FIELD OF THE DISCLOSURE

This disclosure relates to systems and methods related to integrated circuits (ICs) for communication, such as packages having electromagnetic (EM) transducers, such as antennas, embedded with the ICs. The ICs may include signal detector circuits and/or include electromagnetic-energy directing assemblies.

BACKGROUND OF THE DISCLOSURE

Advances in semiconductor manufacturing and circuit design technologies have enabled the development and production of ICs with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic system with at least two PCBs and the need to communicate information between those PCBs, a variety of connector and backplane architectures have been developed to facilitate information flow between the boards. Unfortunately, such connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling.

These characteristics of conventional connectors can lead to degradation of signal integrity and instability of electronic systems needing to transfer data at very high rates, which in turn limits the utility of such products.

SUMMARY OF THE DISCLOSURE

In one example, a system for transmitting or receiving signals may include a transducer configured to convert between electrical signals and electromagnetic signals, an integrated circuit (IC) operatively coupled to the transducer, and insulating material. The IC may contain a transmitter circuit and/or a receiver circuit. A transformer circuit may transform a baseband signal into a radio-frequency signal and conduct the radio-frequency electrical signal to the transducer for transmission as an electromagnetic signal. A receiver circuit may receive from the transducer a radio-frequency electrical signal received as an electromagnetic signal by the transducer and transform the electromagnetic signal into a baseband signal. The IC and the transducer may be at least partly embedded in the insulating material and held in fixed locations relative to each other.

In another example, a system for transmitting or receiving signals may include a transducer configured to convert between radio-frequency electrical signals and radio-frequency electromagnetic signals, an IC operatively coupled to the transducer, and an electromagnetic-energy directing assembly mounted relative to the transducer. The IC may contain a transmitter circuit and/or a receiver circuit. A transmitter circuit may transform a baseband signal into a radio-frequency electrical signal and conducts the radio-frequency signal to the transducer. A receiver circuit may receive from the transducer a radio-frequency electrical signal and transforms the radio-frequency electrical signal into a baseband signal. An electromagnetic-energy directing assembly may direct electromagnetic energy in a region including the transducer and in a direction away from the IC.

In a further example, a system may include a transducer configured to convert electromagnetic signals into electrical signals, and an IC operatively coupled to the transducer. The IC may include a receiver circuit and a signal-detector circuit. The receiver circuit may receive from the transducer a radio-frequency electrical signal and transform the radio-frequency electrical signal into a baseband signal when a control signal has a first state and not when the control signal has a second state different than the first state. The signal-detector circuit may be responsive to a monitor signal representative of the received first radio-frequency electrical signal for generating the control signal with the first state when the monitor signal indicates the received first radio-frequency electrical signal is an acceptable signal and with the second state when the monitor signal indicates the received first radio-frequency electrical signal is not an acceptable signal.

An exemplary method may include receiving by a transducer a radio-frequency electromagnetic signal and converting by the transducer the first radio-frequency electromagnetic signal into a first radio-frequency electrical signal. A receiver circuit of an integrated circuit (IC) may receive the first radio-frequency electrical signal. A monitor signal may be generated that is representative of the received radio-frequency electrical signal. A signal-detector circuit may monitor the monitor signal, and determine whether the monitor signal indicates the received radio-frequency electrical signal is an acceptable signal.

A control signal may be generated with a first state when the monitor signal indicates the received radio-frequency electrical signal is an acceptable signal and with a second state different than the first state when the monitor signal indicates the received radio-frequency electrical signal is not an acceptable signal. The receiver circuit may produce and output a baseband signal from the radio-frequency electrical signal when the control signal has the first state, and not transform the radio-frequency electrical signal into a baseband signal when the control signal has the second state.

BRIEF DESCRIPTION OF THE DRAWINGS

FIG. 1 shows a simplified schematic overhead view of a first example of an Integrated circuit (IC) package including a die and antenna.

FIG. 2 shows a cross-section of the IC package of FIG. 1 taken along line 2-2.

FIG. 3 is an enlarged view of an interconnection of the die and antenna of FIGS. 1 and 2.

FIG. 12 shows a bottom view of the exemplary communication device of FIG. 11.

FIGS. 13 and 14 illustrate a representative radiation pattern resulting from the communication device of FIG. 11 configured as a transmitter.

DETAILED DESCRIPTION OF THE DISCLOSURE

Figure 4:
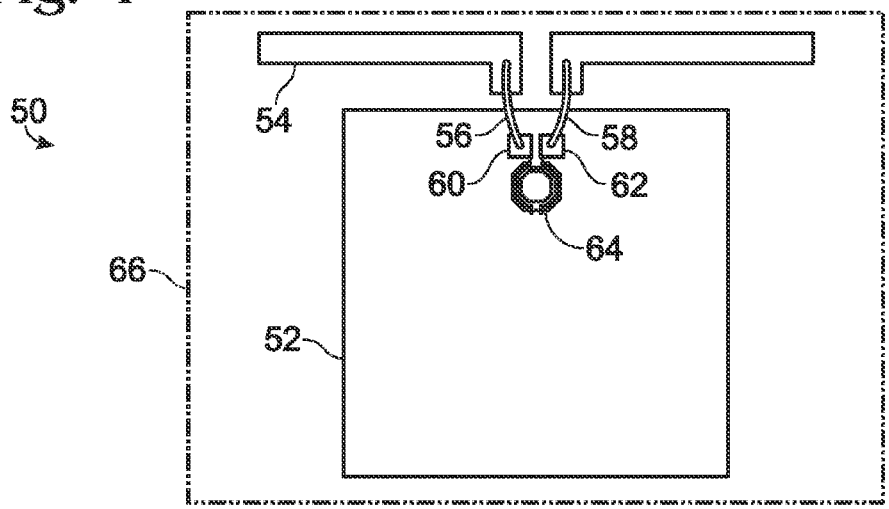
FIG. 4 shows a schematic overhead view of a second example of an IC package including a die and antenna.

Wireless communication may be used to provide signal communications between components on a device or may provide communication between devices. Wireless communication provides an interface that is not subject to mechanical and electrical degradation. Examples of systems employing wireless communication between chips are disclosed in U.S. Pat. No. 5,621,913 and U.S. Published Patent Application No. 2010/0159829, the disclosures of which are incorporated herein by reference in their entirety for all purposes.

In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may be discontiguous with respect to each other. In exemplary versions, the transmitter and receiver may be disposed on separate circuit carriers positioned with the antennas of the transmitter/receiver pair in close proximity.

As discussed below, a transmitter or receiver may be configured as an IC package, in which an antenna may be positioned adjacent to a die and held in place by a dielectric or insulating encapsulation or bond material. A transmitter or receiver may be configured as an IC package, in which an antenna may be positioned adjacent to a die and held in place by encapsulation material of the package and/or a lead frame substrate. Examples of EHF antennas embedded in IC packages are shown in the figures and described below.

FIGS. 1 through 3 show an exemplary IC package, generally indicated at 10. IC package 10 may include a die 12, a transducer 14 providing conversion between electrical and electromagnetic (EM) signals, and conductive connectors 16, such as bond wires 18, 20 electrically connecting the transducer to bond pads 22, 24 connected to a transmitter or receiver circuit included in die 12. IC package 10 may further include an encapsulating material 26 formed around at least a portion of the die and/or the transducer. In this example encapsulating material 26 covers die 12, conductive connectors 16, and transducer 14, and is shown in phantom lines so that details of the die and transducer may be illustrated in solid lines.

Die 12 may include any suitable structure configured as a miniaturized circuit on a suitable die substrate, and is functionally equivalent to a component also referred to as a "chip" or an "integrated circuit (IC)." A die substrate may be any suitable semiconductor material; for example, a die substrate may be silicon. Die 12 may be mounted with further electrical conductors 16, such as a lead frame, not shown in FIGS. 1-3, providing connection to external circuits. An impedance transformer 28, shown in dashed lines, may provide impedance matching between the circuit on die 12 and transducer 14.

Transducer 14 may be in the form of a folded dipole or loop antenna 30, may be configured to operate at radio frequencies, such as in the EHF spectrum, and may be configured to transmit and/or receive electromagnetic signals. Antenna 30 may be separate from but operatively connected to die 12 by any suitable conductors 16, and may be located adjacent to die 12.

The dimensions of antenna 30 may be suitable for operation in the EHF band of the electromagnetic frequency spectrum. In one example, a loop configuration of antenna 30 may include a 0.1 mm band of material, laid out in a loop 1.4 mm long and 0.53 mm wide, with a gap of 0.1 mm at the mouth of the loop, and with the edge of the loop approximately 0.2 mm from the edge of die 12.

Encapsulating material 26 may be used to assist in holding the various components of IC package 10 in fixed relative positions. Encapsulating material 26 may be any suitable material configured to provide electrical insulation and physical protection for the electrical and electronic components of IC package 10. For example, encapsulating material 26, also referred to as insulating material, may be a mold compound, glass, plastic, or ceramic. Encapsulating material 26 may be formed in any suitable shape. For example, encapsulating material 26 may be in the form of a rectangular block, encapsulating all components of IC package 10 except the unconnected ends of conductors 16 connecting the die to external circuits. External connections may be formed with other circuits or components.

FIG. 3 shows an exemplary configuration of a transducer 14 connected to die 12 by bond wires 18 and 20 and bond pads 22 and 24. The bond wires and bond pads may be configured to limit impedance mismatch between transducer 14 and a circuit of die 12. In one exemplary embodiment, bond wires 18 and 20 may be 0.6 mm long, with an overhead measurement (indicated as dimension "L") of approximately 0.3 mm. The bond pads may be approximately 0.066 mm square. Bond wires may also be disposed such that they are approximately 0.074 mm apart at a point of attachment to the respective bond pads (indicated as dimension "B") and approximately 0.2 mm apart at a point of attachment to antenna 20 (indicated as dimension "S"). Impedance matching may be further facilitated by use of transformer 28 shown in FIG. 1.

As shown in FIG. 2, IC package 10 may further include a ground plane 32 mounted to the lower surface of die 12 and a package dielectric substrate 34 that may be similar to a dielectric used for PCBs. Ground plane 32 may be any suitable structure configured to provide an electrical ground for die 12. For example, package ground plane 32 may be a conductive, rectangular, planar structure mounted directly below die 12 on substrate 34. Substrate 34 may have two-sided metallization patterns, such as a metallization pattern 36 on the top surface that includes antenna 30, ground plane 32, and conductors connected to die 12 by a suitable set of conductors 16, such as may be provided by a lead frame or flip-chip bumps as discussed further below. Package 10 may further include external conductors 38 that connect the package to external circuits, such as are represented by flip-chip solder balls or bumps 40. Bumps 40 may be connected to conductors in metallization pattern 36 by ball pads 42 and vias, such as via 44 connecting a bump 46 to ground plane 32.

Figure 5:
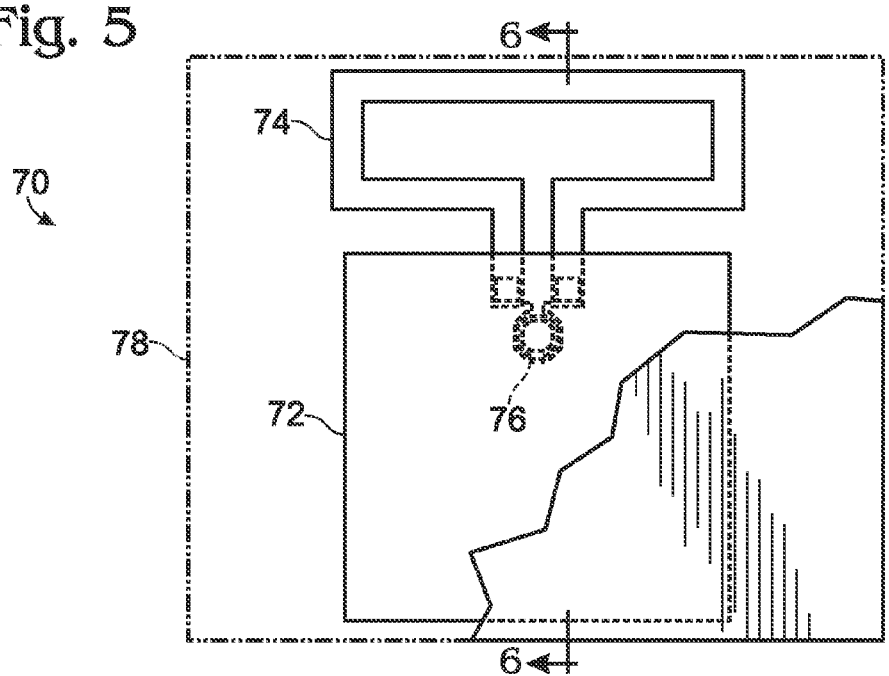
FIG. 5 shows a schematic overhead view of a third example of an IC package including a die and antenna.
Figure 6:
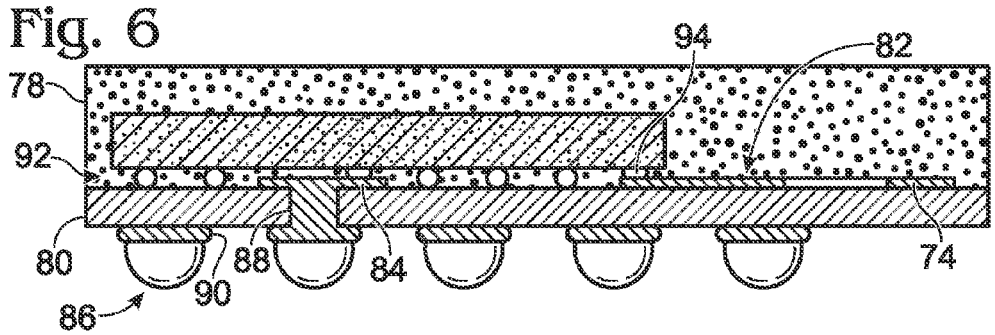
FIG. 6 shows a cross-section of the IC package of FIG. 5 taken along line 6-6.

FIGS. 4 through 6 show other configurations of IC packages. FIG. 4 shows an IC package 50 having a die 52, antenna 54, bond wires 56, 58, bond pads 60, 62, impedance transformer 64, and encapsulating material 66, similar to IC package 10. However, in this example, antenna 54 is a dipole antenna.

FIGS. 5 and 6 illustrate an IC package 70 having a die 72, a folded dipole antenna 74, impedance transformer 76, and encapsulating material 78, a package dielectric substrate 80, a metallization pattern 82 including antenna 74 and a ground plane 84, package bumps 86, via 88, and ball pads 90 also similar to IC package 10. Encapsulating material 78 covers die 72 and antenna 74. However, in this example, die 12 is mounted on metallization pattern 82 in a flip chip configuration by flip-chip bumps 92. In particular, flip chip bumps, such as bump 94, connect conductors extending from antenna 74 to corresponding conductor terminals on the underside of die 72, without the use of bond wires.

Figure 7:
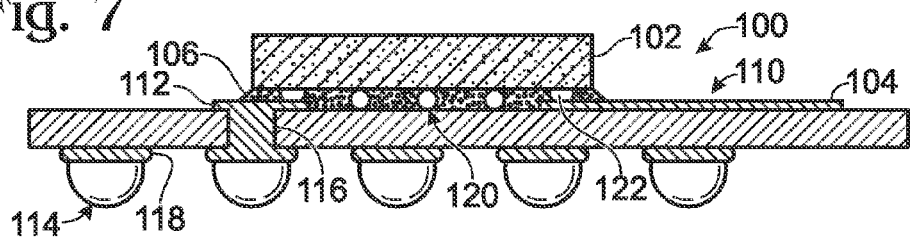
FIG. 7 shows another embodiment of an IC package.

FIG. 7 shows yet another alternate embodiment of an IC package 100 having a die 102, a folded dipole antenna 104, encapsulating material 106, a package dielectric substrate 108, a metallization pattern 110 including antenna 104 and a ground plane 112, package bumps 114, via 116, ball pads 118, and flip-chip bumps 120, similar to IC package 70. Flip-chip bumps 120 include flip-chip bump 122 that, connects conductors extending from antenna 104 to corresponding conductor terminals on the underside of die 102, which is flip-chip mounted to substrate 108. In this example, encapsulating material 106 is used primarily as an underfill between die 102 and substrate 108.

It will be appreciated from the above, that a system for transmitting or receiving signals may include a transducer configured to convert between electrical signals and electromagnetic signals; an integrated circuit (IC) operatively coupled to the transducer, the IC containing at least one of a transmitter circuit that transforms a baseband signal into a radio-frequency signal and conducts the radio-frequency electrical signal to the transducer for transmission as an electromagnetic signal and a receiver circuit that receives from the transducer a radio-frequency electrical signal received as an electromagnetic signal by the transducer and transforms the electromagnetic signal into a baseband signal; and insulating material in which the IC and transducer are at least partly embedded, the insulating material holding the transducer and IC in fixed locations spaced relative to each other.

Such a system may further include a dielectric substrate supporting the transducer, IC and insulating material. The insulating material may completely cover the transducer.

Figure 8:
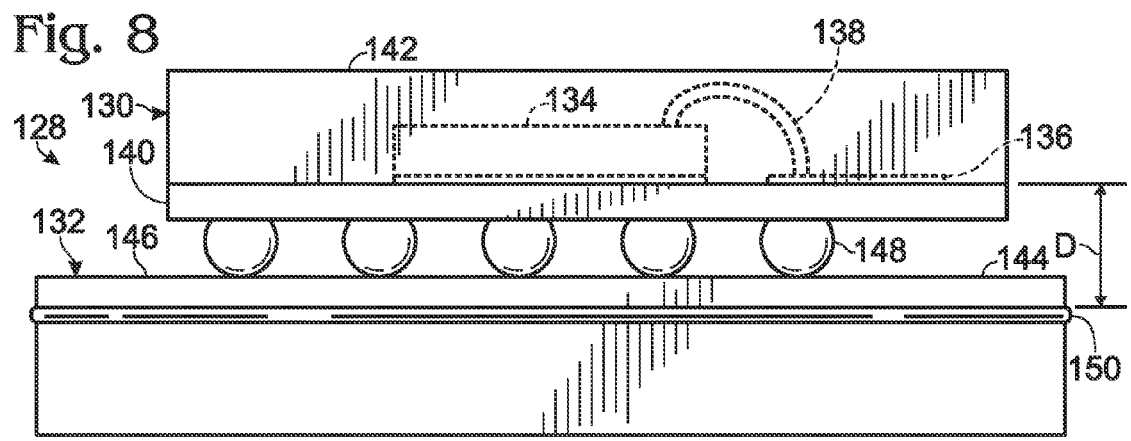
FIG. 8 shows a schematic side view of an exemplary communication device including an IC package and PCB.

FIG. 8 shows a representational side view of a communication device 128 including an IC package 130 flip-mounted to an exemplary printed circuit board (PCB) 132. In this example, it may be seen that IC package 130 includes a die 134, an antenna 136, bond wires, including bond wire 138, connecting the die to the antenna. The die, antenna, and bond wires are mounted on a package substrate 140 and encapsulated in encapsulating material 142. PCB 132 may include a top dielectric layer 144 having a major face or surface 146. IC package 130 is flip-mounted to surface 146 with flip-mounting bumps 148 attached to a metallization pattern (not shown).

PCB 132 may further include a layer 150 spaced from surface 146 made of conductive material forming a ground plane. The PCB ground plane may be any suitable structure configured to provide an electrical ground to circuits and components on PCB 132. Ground-plane layer 150 is spaced below antenna 136 by a distance D. Distance D may be less than the wavelength of a design frequency depending on the configuration and dimensions of the IC package and PCB. For example, PCB ground plane 150 may be located approximately 0.4 mm below mounting surface 146 of PCB 132, and antenna 136 may be mounted in a plane approximately 0.25 mm above mounting surface 146, resulting in a distance D of 0.65 mm between the plane of the antenna and the plane of the ground plane. Operating in the EHF frequency band between 30 and 300 GHz, the wavelengths are between 1 cm and 1 mm.

Figure 9:
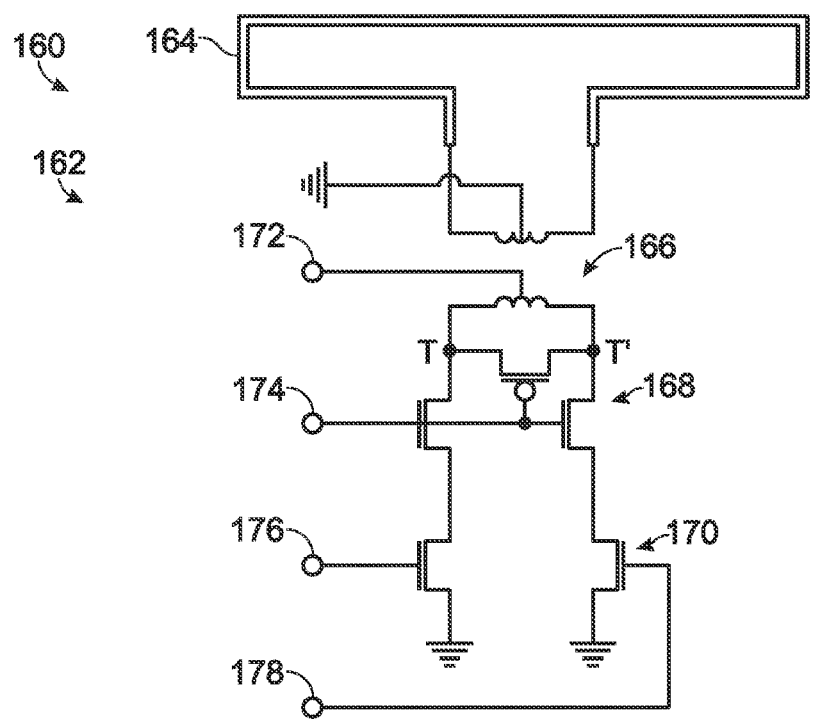
FIG. 9 is a simplified circuit diagram showing portions of an exemplary transmitter circuit and antenna.

FIG. 9 shows a simplified exemplary electronic circuit diagram of a transmitter 160 including a transmitter interface circuit 162 and an antenna 164 coupled to the transmit interface circuit. The transmit interface circuit may be located on a die, such as die 12 shown in FIGS. 1-3, and may include a transformer 166, a modulator 168, and an amplifier 170. In this example, transformer 166 is coupled to antenna 164 and receives power on a primary winding from a terminal 172. The transformer may provide resonant amplification when combined with a power amplifier, and may provide DC blocking and impedance transformation. Modulator 168 may be any suitable modulator, and is illustrated as a pinch device formed of MOSFETs in a cascode configuration that receives an input signal on a terminal 174 used to modulate a carrier signal conducted by amplifier 170. Amplifier 170 in this example includes complementary common-source MOSFETs that are driven by a signal applied to terminals 176 and 178 having a selected carrier frequency produced by a voltage-controlled oscillator.

Figure 10:
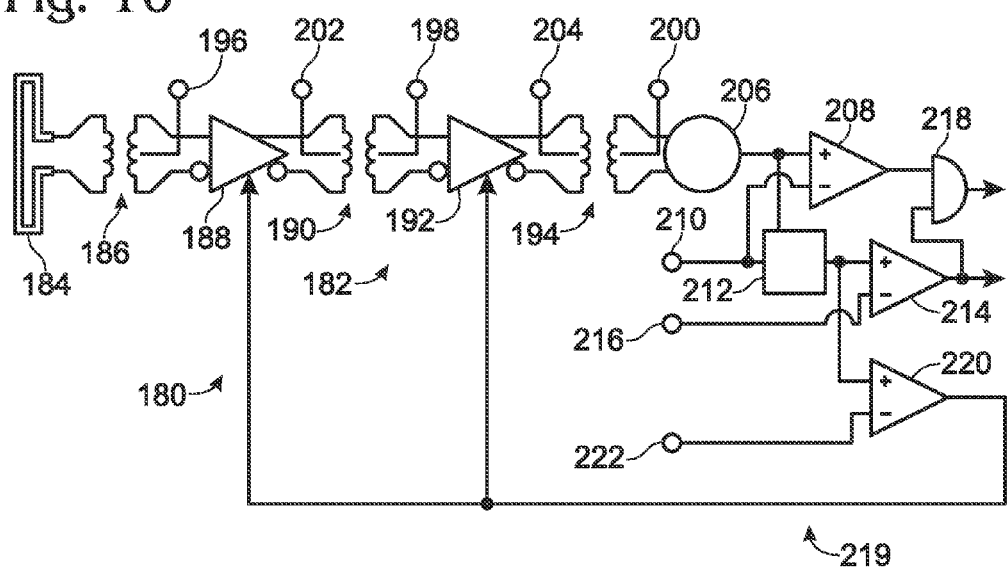
FIG. 10 is a circuit diagram showing portions of an exemplary receiver circuit and antenna.

FIG. 10 shows a simplified diagram of a receiver 180 including a receiver interface circuit 182 and an antenna 184. Interface circuit 182 may be included in the integrated circuit in a die, such as die 12 illustrated in FIGS. 1-3. A received modulated radio-frequency (RF) signal, such as a signal in the EHF band, is conducted through the series connections of transformers and transformer-coupled low-noise amplifiers, including a first transformer 186, amplifier stage 188, a second transformer 190, a second amplifier stage 192, and a third transformer 194. Transformers 186, 190 and 194 may receive a DC bias voltage on respective terminals 196, 198, and 200. Amplifier power may be applied on associated primary windings of transformers 190 and 194 on respective terminal 202 and 204.

The amplified and conditioned RF signal is input into a demodulator 206 that converts the received modulated RF signal into a baseband signal. The signal output from demodulator 206 may then be fed into a further output comparator 208. Comparator 208 also receives an input/output threshold level reference signal from a terminal 210.

In this example, the baseband signal is a binary signal. The output from comparator 208 is a logic 1 if the demodulated baseband signal is above the threshold and is a logic 0 if the demodulated baseband signal is below the threshold.

One or more comparators may also compare an average level of a monitor signal to a predetermined minimum threshold level to determine if a received signal is strong enough to be considered valid. It may be necessary for the receiver antenna to be sufficiently close to a transmitter antenna to communicate a sufficiently strong signal. A predetermined minimum threshold level may be set to ensure the electromagnetic signal from a transmitter is considered valid and therefore processed by a receiver if the transmitter antenna and receiver antenna are within a desired physical communication range, such as 5 mm to 10 mm.

More specifically, the demodulated baseband signal output from demodulator 206 may be input into a low-pass filter 212 in combination with the input-output reference provided on terminal 210. The output of the filter is a monitor signal representative of the average strength of the received demodulated baseband signal, which in turn is representative of the average strength of the received RF signal. This average-strength monitor signal is input to a second comparator 214 along with a signal-detect threshold reference signal received on a terminal 216. Comparator 214 thereby monitors the monitor signal output from filter 212 and determines whether the received signal is a sufficiently strong signal.

The output from comparator 214, then, is a signal-detect control signal that may have one of two states. In a first state, the control signal indicates that the received signal has sufficient strength to be considered a valid signal. In the second state, the control signal indicates that the received signal does not have sufficient strength. The control signal from comparator 214 and the demodulated baseband signal from comparator 208 are input into an AND gate 218. The AND gate then outputs the baseband signal when the control signal is in the first state, indicating that a sufficiently strong signal is being received. If the control signal is in the second state, the AND gate is disabled, and no baseband signal is output from receiver interface circuit 182. The signal-detect signal output from comparator 214 may also be output to other circuits on the die or PCB on which the IC is mounted for other uses as appropriate.

Interface circuit 182 may also have an automatic gain control (AGC) circuit 219. AGC circuit 219 may include a third comparator 220 that also receives the output from filter 212 as a signal representative of the average strength of the received signal. Comparator receives as a reference signal an AGC target level signal on a terminal 222. The comparator then produces an output AGC signal that is fed back to amplifier stages 188 and 192 to control the gain of those amplifiers. The AGC circuit maintains a received sufficiently strong signal at a desired level for output by the receiver interface circuit. It will be seen then that the baseband signal input into signal-detect comparator 214 is a conditioned received signal the level of which is modified by amplifier stages 188 and 192 in response to the AGC control signal. If the monitor signal is not sufficiently strong, even with automatic gain control, then AND gate 218 is disabled and no baseband signal is output.

From the above, it will be apparent that in some examples, a system may include a first transducer configured to convert electromagnetic signals into electrical signals; and a first IC operatively coupled to the transducer, the IC including a receiver circuit for receiving from the transducer a first radio-frequency electrical signal and transforming the first radio-frequency electrical signal into a first baseband signal, and outputting the first baseband signal when a control signal has a first state and not when the control signal has a second state different than the first state, and a signal-detector circuit responsive to a monitor signal representative of the received first radio-frequency electrical signal for generating the control signal with the first state when the monitor signal indicates the received first radio-frequency electrical signal is an acceptable signal and with the second state when the monitor signal indicates the received first radio-frequency electrical signal is not an acceptable signal.

The signal-detector circuit may include a comparator for comparing a characteristic of the monitor signal to a reference, the comparator generating an output signal indicating how the characteristic of the monitor signal compares to the reference, the signal-detector circuit generating the control signal in response to the output signal. The characteristic of the monitor signal may be representative of strength of the received first radio-frequency signal, and the reference is representative of a threshold signal strength below which reception is disabled and above which reception is enabled. The characteristic of the monitor signal may be representative of average signal strength.

In some examples, such a system may further include a second transducer configured to convert electrical signals into electromagnetic signals, the second transducer being disposed sufficiently close to the first transducer for the first transducer to receive electromagnetic signals produced by the second transducer; and a second IC operatively coupled to the second transducer, the second IC containing a transmitter circuit for receiving a second baseband signal and transforming the second baseband signal into a second radio-frequency electrical signal and conducting the second radio-frequency electrical signal to the second transducer.

In some examples, a method may include receiving by a first transducer a first radio-frequency electromagnetic signal; converting by the first transducer the first radio-frequency electromagnetic signal into a first radio-frequency electrical signal; receiving from the transducer by a receiver circuit of an integrated circuit (IC) the first radio-frequency electrical signal; generating a monitor signal representative of the received first radio-frequency electrical signal; monitoring by a signal-detector circuit the monitor signal; determining whether the monitor signal indicates the received first radio-frequency electrical signal is an acceptable signal; generating a control signal with a first state when the monitor signal indicates the received first radio-frequency electrical signal is an acceptable signal and with a second state different than the first state when the monitor signal indicates the received first radio-frequency electrical signal is not an acceptable signal; transforming by the receiver circuit the first radio-frequency electrical signal into a first baseband signal when the control signal has the first state; and not transforming by the receiver circuit the first radio-frequency electrical signal into a first baseband signal when the control signal has the second state.

Determining whether the monitor signal indicates the received first radio-frequency electrical signal is an acceptable signal may include comparing a characteristic of the monitor signal to a reference; generating an output signal indicating how the characteristic of the monitor signal compares to the reference; and generating the control signal includes generating the control signal in response to the output signal. The characteristic of the monitor signal may be representative of strength of the received first radio-frequency signal, and the reference may be representative of a threshold signal strength below which reception is disabled and above which reception is enabled. The characteristic of the monitor signal may be representative of average signal strength In some examples, such a method may further include receiving by a second IC containing a transmitter circuit a second baseband signal; transforming the second baseband signal into a second radio-frequency electrical signal; conducting the second radio-frequency electrical signal to a second transducer; positioning the second transducer sufficiently close to the first transducer for the first transducer to receive electromagnetic signals produced by the second transducer; and converting by the second transducer the second radio-frequency electrical signal into the first radio-frequency electromagnetic signal.

Figure 11:
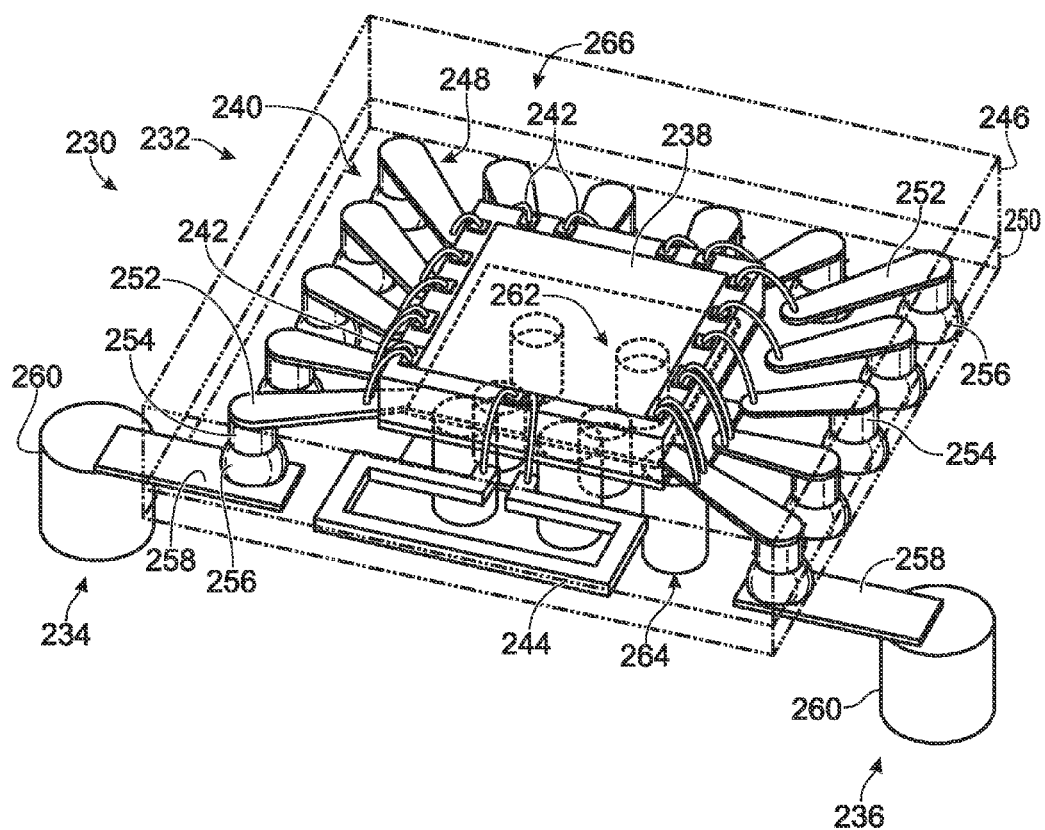
FIG. 11 shows an isometric view of another exemplary communication device including an IC package with external circuit conductors.

FIGS. 11 and 12 illustrate another exemplary communication device 230 including an IC package 232 with external circuit conductors 234 and 236. In this example, IC package 232 may include a die 238, a lead frame 240, conductive connectors 242 in the form of bond wires, an antenna 244, encapsulating material 246, and other components not shown to simplify the illustration. Die 236 may be mounted in electrical communication with lead frame 240, which may be any suitable arrangement of electrical conductors 248 configured to allow one or more other circuits to operatively connect with die 238. Antenna 244 may be constructed as a part of the manufacturing process that produces lead frame 240.

Leads 248 may be embedded or fixed in a lead frame substrate 250, shown in phantom lines, corresponding to package substrate 34 shown in FIG. 2. The lead frame substrate may be any suitable insulating material configured to substantially hold leads 248 in a predetermined arrangement. Electrical communication between die 238 and leads 248 of lead frame 240 may be accomplished by any suitable method using conductive connectors 242. As mentioned, conductive connectors 242 may include bond wires that electrically connect terminals on a circuit of die 238 with corresponding conductors 248. For example, a conductor 248 may include a plated lead 252 formed on an upper surface of lead frame substrate 250, a via 254 extending through the substrate, a flip-mounting bump 256 mounting IC package 232 to a circuit on a base substrate, such as a PCB, not shown. The circuit on the base substrate may include a external conductors, such as external conductor 234, which for example, may include a strip conductor 258 connecting bump 256 to a further via 260 extending through the base substrate. Other vias 262 may extend through the lead frame substrate 250 and there may be additional vias 264 extending through the base substrate.

In another example, die 238 may be inverted and conductive connectors 242 may include bumps, or die solder balls, as described previously, which may be configured to electrically connect points on a circuit of die 238 directly to corresponding leads 248 in what is commonly known as a "flip chip" arrangement.

Lead frame 240 may be configured to create what may be considered a radiation shaper 266 forming effectively a wire mesh backstop for radiation transmitted by antenna 244 or radiation received from an external antenna. Other circuit connectors may also contribute to the radiation reflector, including conductive connectors 242, various combinations of external conductors 234 and 236. The conductors may conduct active signals or be circuit grounds because electromagnetic signals of sufficiently high frequencies that both types of conductors contribute to the reflections or shaping of the radiation. The shaping effect applies to received as well as transmitted radiation. Additionally, various shaping effects are possible, and it may be desirable in some embodiments to have reduced or insubstantial directional shaping effect, essentially creating an electromagnetic signal with omni-directional or hemispherical qualities.

Lead frame 240 may be configured with conductors 248 separated by a pin pitch or gap, such as distance G shown in FIG. 12. Distance G may be effective if it is significantly less than one wavelength of an operating frequency of the transmitter or receiver. For example, the pin pitch may be configured to be 1/10th of the wavelength. This configuration may effectively create a wire mesh, providing a backstop for antenna 244 and directionally shaping an associated electromagnetic signal and directing it substantially away from die 238.

Figure 14:
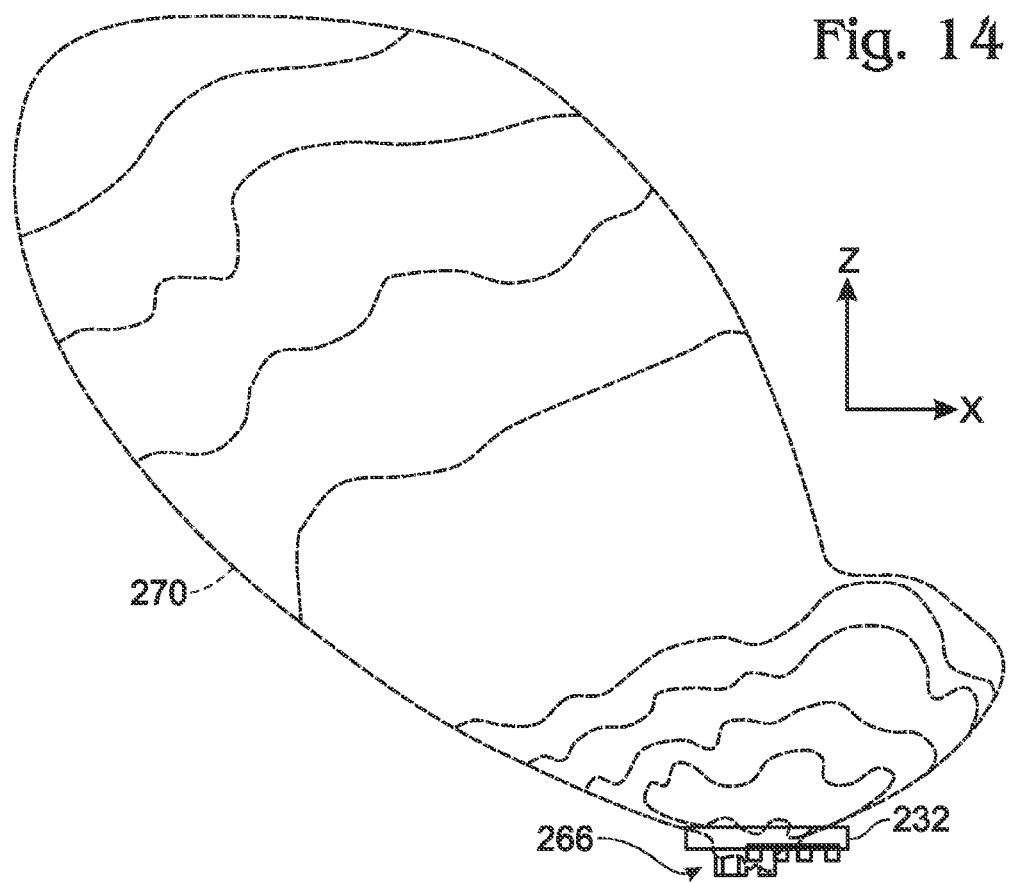

FIGS. 13 and 14 illustrate a characteristic radiation pattern 270 produced by a simulation of an electromagnetic signal emanating from an exemplary transmitting IC package 232 having the radiation shaper 266 described with reference to FIGS. 11 and 12. The indicated layers represented in the figures generally corresponds with increasing gain with distance from IC package 232 As seen by the radiation patterns in FIGS. 13 and 14, the radiation is directed away from die 238 and lead frame 240, shown in FIGS. 11 and 12, in a direction corresponding to the side of die 238 on which antenna 244 is mounted.

Further or alternative shaping of the electromagnetic signal may be accomplished by the configuration of a ground plane 150 in a PCB 132 of a communication device as described with reference to FIG. 8, generally deflecting an electromagnetic signal in a direction dependent on the configuration of the PCB ground plane 150 relative to antenna 136 embedded in the right end of IC package 130 as viewed in FIGS. 15 and 16. These figures illustrate idealized radiation patterns that may result from different configurations, and are not the results of simulations of these configurations. Actual radiation patterns are dependent on relative configurations, actual structures, and the strength of applied signals.

Figure 15:
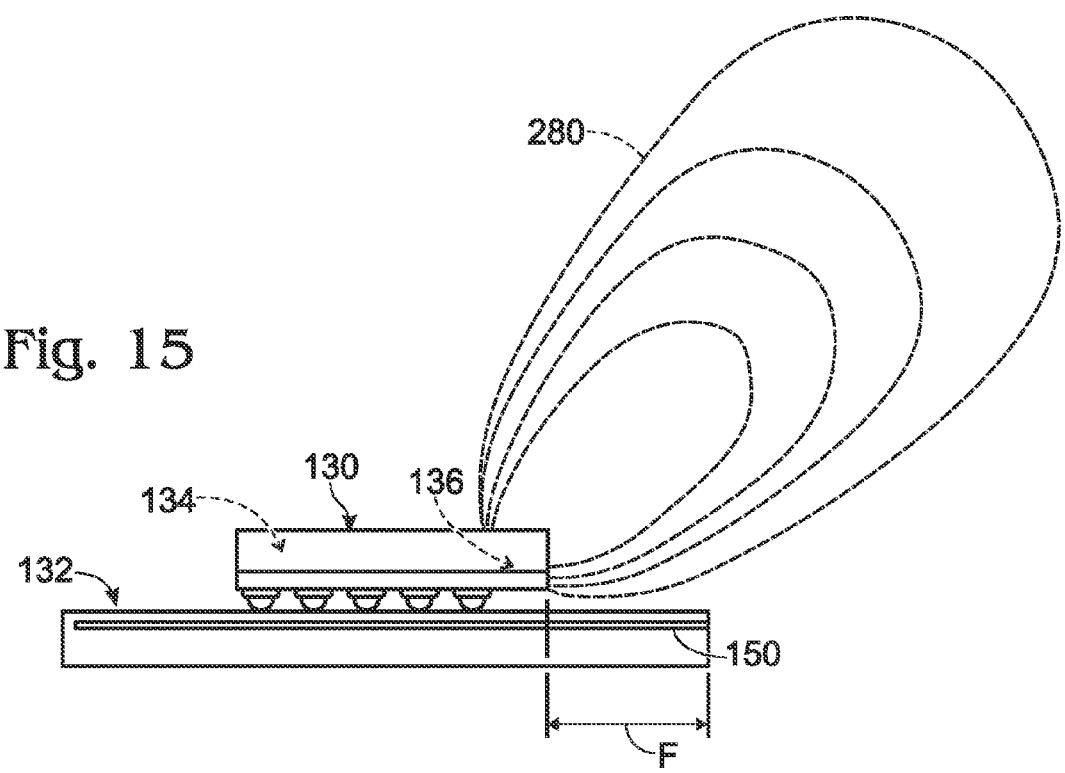
FIGS. 15 and 16 show transmitting devices with two different exemplary configurations of PCB ground planes and stylized representations of resulting radiation patterns.

In the configuration shown in FIG. 15, ground plane 150 extends out past the antenna in IC package 130 by a distance F that is well beyond the antenna opposite from the position of die 134. It is seen that resulting radiation 280 extends upwardly away from ground plane 150 and away from IC package 130.

Figure 16:
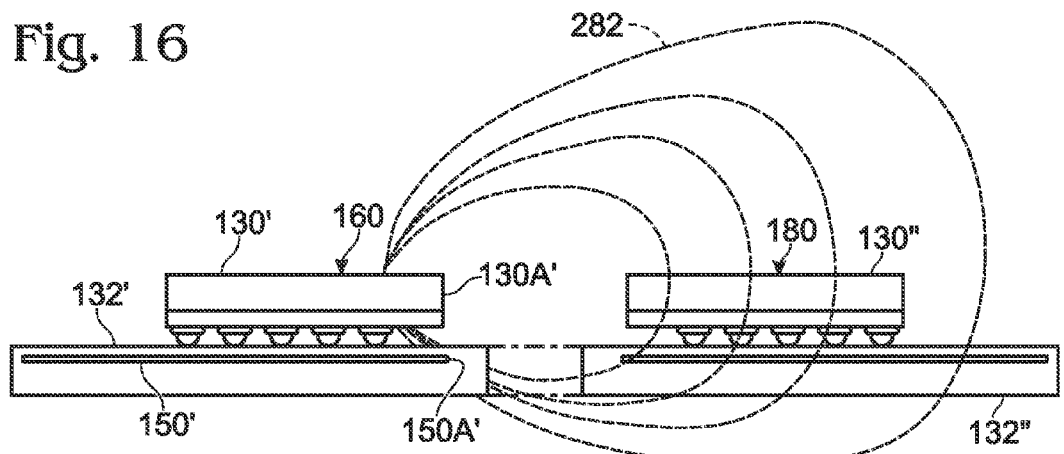

As shown in FIG. 16, first IC package 130' may be mounted for communication with a second IC package 130". Either IC package 10 may be configured to transmit and/or receive electromagnetic signals, providing one- or two-way communication between the two IC packages and any respective accompanying electronic circuits or components that each is connected to. First IC package 130' is shown mounted to a first PCB 132' and second IC package 130" is shown mounted to a second PCB 132", whereby the IC packages provide inter-PCB communication. In other examples, first and a second IC packages 130' and 130" may be co-located on a single PCB, such as PCB 132', as indicated by the phantom lines between the PCBs to provide intra-PCB communication.

First IC package 130' may include a transmitter 160 as described with reference to FIG. 9. Correspondingly, second IC package 130" may include a receiver 180 as described with reference to FIG. 10. The appropriate relative positions for IC package 130' and IC package 130" may be determined by operation of the signal detect circuit of receiver interface circuit 182 as described with reference to FIG. 10.

Additionally, a ground plane 150' in PCB 132' may have a leading edge 150A' that is generally in line with the antenna end 130A' of IC package 130'. With the ground plane recessed under IC package 130', it is seen that the radiation 282 extends from end 130A' more to the right in FIG. 16 than the radiation shown in FIG. 15. The radiation may thereby be directed more toward receiver IC package 130", depending on the actual configuration used. The configuration of a ground plane relative to the antenna may thus also function as a radiation shaper.

Figure 17:
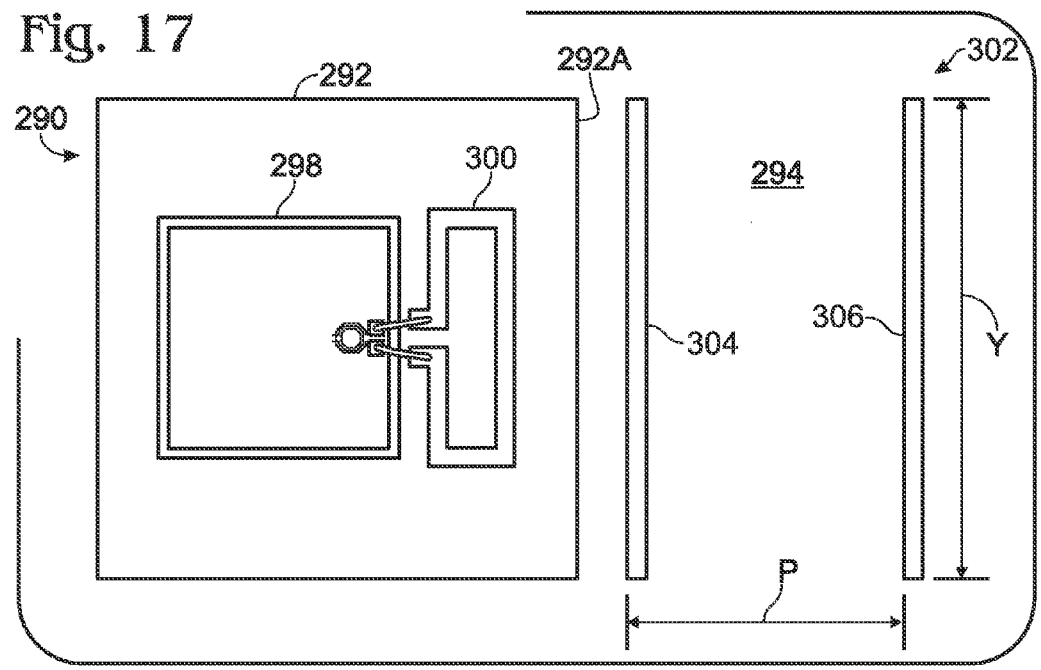
FIG. 17 shows an overhead schematic view of an exemplary transmitting device having spaced external director structures.
Figure 18:
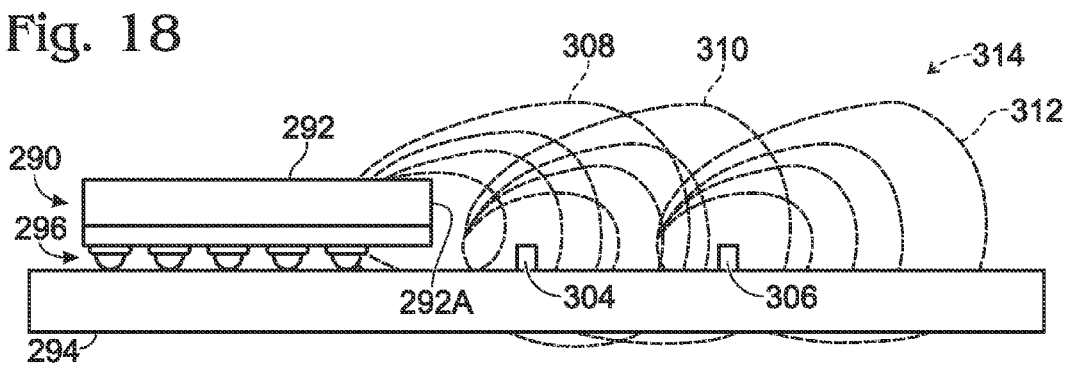
FIG. 18 shows a side schematic view of the transmitting device of FIG. 17, showing a stylized representative radiation pattern.

Additional radiation directing may be provided by conductive elements spaced from the antenna, which conductive elements also may function as a radiation shaper. An example is shown in FIGS. 17 and 18, which illustrate a communication device 290 including an IC package 292 mounted onto a PCB 294 by package mounting bumps 296. PCB extends beyond IC package 292 away from an end 292A of the IC package that contains a die 298 and an antenna 300, as discussed with reference to FIGS. 1-3, for example. In this example, an array 302 of external director structures, including director structures 304 and 306 are disposed away from IC package end 292A. Arrays with other forms of director structures or more or fewer director structures may be used.

External director structures 304 and 306 may be any suitable structure configured to passively retransmit electromagnetic radiation. External director structures 304 and 306 may be made of any conductive material; for example, copper, aluminum, and/or gold. The director structures may be placed at periodic or otherwise spaced intervals from transmitting antenna end 292A of transmitting IC package 292. For example, the external director structures may be elongate conductive bars having a length Y approximately 1 mm long and spaced a distance P approximately 1 mm apart, as generally shown in FIGS. 17 and 18. In this example, radiation 308 transmitted by antenna 300 may energize director structure 304, producing radiation 310. Radiation 310 in turn may energize director structure 306, producing radiation 312. Additional director structures may extend the radiation pattern further. It is seen then that a composite elongate radiation pattern 314 may be produced that extends the radiation in an associated direction beyond the radiation that would otherwise be produced by antenna 300 without such director structures.

It will thus be appreciated that locating an antenna or other transducer off-chip may result in effective antenna impedance matching, independent antenna design, increased transmission power, and selective directional shaping of a resulting radiation pattern. The radiation may thus be directed in a direction where a receiving antenna may be positioned. Locating an antenna within the package may also provide a customer with a more complete assembly that incorporates characteristics of the assembly to satisfy specifications and tailored operating characteristics, besides protecting an incorporated antenna from damage.

Accordingly, a system as described above for transmitting or receiving signals may include a transducer configured to convert between radio-frequency electrical signals and radio-frequency electromagnetic signals; an integrated circuit (IC) operatively coupled to the transducer, the IC containing at least one of a transmitter circuit that transforms a baseband signal into a radio-frequency electrical signal and conducts the radio-frequency signal to the transducer and a receiver circuit that receives from the transducer a radio-frequency electrical signal and transforms the radio-frequency electrical signal into a baseband signal; and an electromagnetic-energy directing assembly mounted relative to the transducer for directing electromagnetic energy in a region including the transducer and in a direction away from the IC.

In some examples, the directing assembly includes a lead frame providing external connections to conductors on the IC, and the transducer is configured to convert signals having a predetermined wavelength and the lead frame is spaced from the transducer and includes a plurality of separate conductor elements distributed about the IC and disposed sufficiently close together to reflect electromagnetic energy having the predetermined wavelength. At least a portion of the conductor elements may each be spaced apart from adjacent conductor elements by less than one sixth of the predetermined wavelength. The lead frame may reflect electromagnetic energy converted by the transducer predominantly away from the lead frame in a direction associated with the transducer. The transducer may be disposed on a first side of the IC on which the lead frame is not disposed. The lead frame may be disposed at least along second and third sides of the IC that are each adjacent to the first side. The lead frame may be configured to cause received electromagnetic energy to be stronger in a region including the transducer and extending away from the lead frame than in a region including the lead frame and extending away from the transducer.

A dielectric substrate to which is mounted the IC, lead frame, and transducer, and a printed circuit board (PCB) may have a major face on which the dielectric substrate is mounted. The directing assembly further may include a ground plane mounted on the PCB, the ground plane being spaced from and parallel to the major face of the PCB with the transducer spaced from the ground plane. The PCB may extend away from the transducer opposite the IC, with the directing assembly including one or more elongate conductive elements disposed in spaced-apart positions on the PCB along a line extending in a direction away from the transducer. The one or more conductive elements may each extend transversely of the line.

The system may further include a dielectric substrate to which are mounted the IC and transducer, and a printed circuit board (PCB) having a major face on which the dielectric substrate is mounted, with the directing assembly further including a ground plane mounted on the PCB in line with the transducer. The transducer may be disposed away from the ground plane a preselected distance that is greater than 0.25 mm. The ground plane may extend parallel to the major face of the PCB below the IC and terminate at an edge aligned with the transducer, whereby radiation transmitted by the transducer is directed away from the transducer in a direction predominantly away from the IC. The ground plane may extend along the IC and transducer and beyond the transducer, whereby radiation transmitted by the transducer is directed away from the ground plane.

In some examples, the system may further include a PCB having a major face on which the IC and transducer are mounted. The major face of the PCB may extend away from the transducer opposite the IC. The directing assembly may include one or more elongate conductive elements disposed in spaced-apart positions on the PCB along a line extending in a direction away from the transducer, the one or more conductive elements each extending transversely of the line.

INDUSTRIAL APPLICABILITY

The inventions described herein relate to industrial and commercial industries, such as electronics and communications industries using devices that communicate with other devices or devices having communication between components in the devices.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

What is claimed is:

1. A system comprising:
a first transducer configured to convert electromagnetic signals into electrical signals; and
a first integrated circuit (IC) operatively coupled to the first transducer, the IC including:
a receiver circuit for receiving from the first transducer a first radio-frequency electrical signal and transforming the first radio-frequency electrical signal into a first baseband signal, and outputting the first baseband signal when a control signal has a first state and not when the control signal has a second state different than the first state; and
a signal-detector circuit generating a monitor signal representative of a strength of the received first radio-frequency electrical signal based on the first baseband signal, the signal-detector circuit further generating the control signal with the first state when the monitor signal indicates the received first radio-frequency electrical signal is an acceptable signal and with the second state when the monitor signal indicates the received first radio-frequency electrical signal is not an acceptable signal,
wherein the signal-detector circuit includes a comparator for comparing the monitor signal representative of the strength of the received radio-frequency electrical signal to a reference corresponding to a predetermined threshold level, the signal-detector circuit generating the control signal in response to an output of the comparator.

2. The system of claim 1, wherein the reference is representative of a threshold signal strength below which reception is disabled and above which reception is enabled.

3. The system of claim 1, wherein the monitor signal is representative of average signal strength.

4. The system of claim 1, further comprising:
a second transducer configured to convert electrical signals into electromagnetic signals, the second transducer being disposed sufficiently close to the first transducer for the first transducer to receive electromagnetic signals produced by the second transducer; and
a second IC operatively coupled to the second transducer, the second IC containing a transmitter circuit for receiving a second baseband signal and transforming the second baseband signal into a second radio-frequency electrical signal and conducting the second radio-frequency electrical signal to the second transducer.

5. The system of claim 1, wherein the electromagnetic signals converted by the first transducer are in an extremely high frequency (EHF) band.

6. The system of claim 1, further comprising:
a gain control circuit to compare the monitor signal to a target level signal and to generate a gain control signal based on the comparison,
wherein the receiver circuit comprises one or more amplifiers to amplify the first radio-frequency electrical signal based on the gain control signal.

7. The system of claim 1, wherein the signal detector circuit comprises a low pass filter to generate the monitor signal by low pass filtering the first baseband signal.

8. A method comprising:
receiving by a first transducer a first radio-frequency electromagnetic signal;
converting by the first transducer the first radio-frequency electromagnetic signal into a first radio-frequency electrical signal;
receiving from the transducer by a receiver circuit of an integrated circuit (IC) the first radio-frequency electrical signal;
transforming, by the receiver circuit, the first radio-frequency electrical signal into a first baseband signal;
generating a monitor signal representative of a strength of the received first radio-frequency electrical signal based on the first baseband signal;
monitoring by a signal-detector circuit the monitor signal;
determining whether the monitor signal indicates the received first radio frequency electrical signal is an acceptable signal, wherein determining whether the monitor signal indicates the received first radio-frequency electrical signal is an acceptable signal includes comparing the monitor signal to a reference corresponding to a predetermined threshold level;
generating a control signal with a first state when the monitor signal indicates the received first radio-frequency electrical signal is an acceptable signal and with a second state different than the first state when the monitor signal indicates the received first radio-frequency electrical signal is not an acceptable signal, the control signal generated based on a result of the comparing the monitor signal to the reference;
outputting by the receiver circuit the first baseband signal when the control signal has the first state; and
preventing by the receiver circuit the first baseband signal from being output when the control signal has the second state.

9. The method of claim 8, wherein the reference is representative of a threshold signal strength below which reception is disabled and above which reception is enabled.

10. The method of claim 8, wherein the monitor signal is representative of average signal strength.

11. The method of claim 8, further comprising:
receiving by a second IC containing a transmitter circuit a second baseband signal;
transforming the second baseband signal into a second radio-frequency electrical signal;
conducting the second radio-frequency electrical signal to a second transducer;
positioning the second transducer sufficiently close to the first transducer for the first transducer to receive electromagnetic signals produced by the second transducer; and converting by the second transducer the second radio-frequency electrical signal into the first radio-frequency electromagnetic signal.

12. The method of claim 8, wherein the first radio-frequency electromagnetic signal is in an extremely high frequency (EHF) band.

13. The method of claim 8, further comprising:
comparing the monitor signal to a target level signal and generating a gain control signal based on the comparison; and
amplifying the first radio-frequency electrical signal based on the gain control signal.

14. The system of claim 8, wherein the monitor signal is generated by low pass filtering the first baseband signal.

* * * * *